United States Patent
Ho et al.

(10) Patent No.: US 9,583,711 B2
(45) Date of Patent: Feb. 28, 2017

(54) CONDUCTIVE AND PHOTOSENSITIVE POLYMERS

(71) Applicant: Nano and Advanced Materials Institute Limited, Honk Kong (HK)

(72) Inventors: Paul Kwok Keung Ho, Hong Kong (HK); Wing Leung Wong, Hong Kong (HK)

(73) Assignee: Nano and Advanced Materials Institute Limited, Hong Kong (HK)

(*) Notice: Subject to any disclaimer, the term of this patent is extended or adjusted under 35 U.S.C. 154(b) by 112 days.

(21) Appl. No.: 14/288,397

(22) Filed: May 28, 2014

(65) Prior Publication Data

US 2014/0353552 A1     Dec. 4, 2014

Related U.S. Application Data

(60) Provisional application No. 61/855,965, filed on May 29, 2013.

(51) Int. Cl.
*H01B 1/00* (2006.01)
*H01L 51/00* (2006.01)
(Continued)

(52) U.S. Cl.
CPC ........ *H01L 51/0036* (2013.01); *C08G 61/123* (2013.01); *C08G 61/126* (2013.01); *C09K 11/06* (2013.01); *H01B 1/127* (2013.01); *H01L 51/0003* (2013.01); *H01L 51/0039* (2013.01); *H01L 51/0043* (2013.01); *C08G 2261/143* (2013.01); *C08G 2261/1432* (2013.01); *C08G 2261/3223* (2013.01); *C08G 2261/3246* (2013.01); *C08G 2261/91* (2013.01); *C08G 2261/92* (2013.01); *C08G 2261/95* (2013.01); *C09K 2211/1458* (2013.01); *H01L 51/0047* (2013.01); *H01L 51/0558* (2013.01); *H01L 51/4253* (2013.01); *Y02E 10/549* (2013.01)

(58) Field of Classification Search
CPC .................................. H01B 1/00; H01B 1/127
See application file for complete search history.

(56) References Cited

U.S. PATENT DOCUMENTS 5,276,102 A * 1/1994 Rossi ........................ C08F 8/00
                                                         252/500
2005/0124784 A1    6/2005 Sotzing

FOREIGN PATENT DOCUMENTS

EP     0261837     3/1988
EP     0834885     1/2002
(Continued)

OTHER PUBLICATIONS

"3-thiophenamine" product literature webpage http://www.guidechem.com/dictionary/17721-06-1.html (2010).*
(Continued)

*Primary Examiner* — Mark Kopec
(74) *Attorney, Agent, or Firm* — Eagle IP Limited; Jacqueline C. Lui

(57) ABSTRACT

The present invention relates to newly functionalized polythiophenes and the syntheses thereof. The present invention also demonstrates that the new polythiophenes and their derivatives are suitable for fabricating organic light emitting diodes (OLEDs), light emitting diodes (PLEDs), organic photovoltaic devices (OPVs) and conducting polymers for printed electronic devices.

10 Claims, 20 Drawing Sheets

(51) Int. Cl.
*C08G 61/12* (2006.01)
*C09K 11/06* (2006.01)
*H01B 1/12* (2006.01)
*H01L 51/05* (2006.01)
*H01L 51/42* (2006.01)

(56) References Cited

FOREIGN PATENT DOCUMENTS

| WO | WO2006101953 | 9/2006 |
|---|---|---|
| WO | WO2013006357 | 1/2013 |

OTHER PUBLICATIONS

Andrew C. Grimksdale et al, "Synthesis of Light-Emitting Conjugated Polymers for Applications in Electroluminescent Devices", Chem. Rev. 2009, 109, 897-1091.
Gianni Zotti et al, "Novel polythiophene regular copolymers from 3',4'-diamino- and 3',4'-dinitro-terthiophenes Modulation of electronic properties via post-polymerization functionalization", Electrochimica Acta. 2005, 50, 1469-1474.
Qing T. Zhang and James M. Tour, "Low optical Bandgap polythiophenes by an alternating donor / acceptor repeat unit strategy", J. Am. Chem. Soc. 1997, 119, 5065-5066.
Ogawa Katsu et al, "Nitrogen-functionalized polythiophenes: potential routes to new low band gap materials", Synthetic Metals, 2005, 152, 137-140.
Makoto Miyasaka et al, "Magnetic and electrical properties of poly(3-radical-substituted thiophene)s", Polyhedron, 2001, 20, 1157-1162.
Byoungchul Lee et al, "Ring-sulfonated Poly(thienothiophene)", Adv. Mater. 2005, 17, 1792.
Yasemin Arslan Udum et al, "Electropolymerization of self-doped polythiophene in acetonitrile containing FSO3H", Synth. Met. 2004, 142, 7.
Yasemin Arslan Udum et al, "Electrochemical synthesis of soluble sulfonated poly(3-methyl thiophene)", Eur. Poly. J. 2004, 40, 1057.
Gisela L. Schulz et al., "Hign band gap poly(9,9-dihexylfluorene-alt-bithiophene) blended with [6,6]-phenyl C 61 butyric acid methyl ester for use in efficient phorovoltaic devices", Applied Physics Letter. 2009, 94, 023302.
Meyer, V., (1883). Ueber den begleiter des benzols im steinkohlentheer. Berichte der deutschen chemischen Gesellschaft, 16(1), 1465-1478. (No English language translation or Abstract provided).
Yamamoto, T., Sanechika, K., & Yamamoto, A., (1980). Preparation of thermostable and electric-conducting poly (2, 5- thienylene). Journal of Polymer Science: Polymer Letters Edition, 18(1), 9-12.
Roncali, J., et. al., (1989). A molecular approach of poly (thiophene) functionalization. Synthetic Metals, 28(1-2), 341-348.
Roncali, J., (1997). Synthetic principles for bandgap control in linear π-conjugated systems. Chemical reviews, 97(1), 173-205.
McCullough, R. D., (1998). The chemistry of conducting polythiophenes. Advanced Materials, 10(2), 93-116.
Mishra, A., et. al., (2009). Functional Oligothiophenes: Molecular Design for Multidimensional Nanoarchitectures and Their Applications. Chemical reviews, 109(3), 1141-1276.
Anne Donat-Bouillud, et al., (2000). Light-Emitting Diodes from Fluorene-Based π-Conjugated Polymers, Mater. 12, 1931-1936.
Gang Li, et al., (2005). High-Efficiency Solution Processable Polymer Photovoltaic Cells by Self-organization of Polymer Blends, Nature Materials. 4: 864-868.

\* cited by examiner (A). Ethanol (B). Acetone (C). Ethyl acetate (D). Toluene (A)　　(B)　　(C)　　(D)　　(E)

(A)   (B)   (C)   (D)   (E)

CONDUCTIVE AND PHOTOSENSITIVE POLYMERS

CROSS-REFERENCE TO RELATED APPLICATION

This application claims benefit under 35 U.S.C. §119(e) of U.S. Provisional Application having Ser. No. 61/855,965 filed on 29 May, 2013, which is hereby incorporated by reference herein in its entirety.

FIELD OF INVENTION

This invention relates to a novel polymer, in particular, a newly functionalized polythiophene, and the syntheses as well as the applications thereof.

BACKGROUND OF INVENTION

Photovoltaics are currently one of the most research-intensive areas globally in search for new technology to obtain reasonably priced and renewable green energy from sunlight. The technology development nowadays has come very diverse in the photovoltaic field. Among these developed technologies, energy saving devices such as organic light emitting diodes (OLEDs), polymer light emitting diodes (PLEDs), and organic photovoltaic devices (OPVs) are undergoing mass production and applications based on the advanced materials have been developed in recent years. However, there are still some key unsolved problems including low power conversion efficiency and high production cost for the active donor and acceptor materials (typically P3HT and PCBM) in the bulk heterojunction polymer solar cell. Up to now, the power conversion efficiency (PCE) is about 7% using PFN (poly[(9,9-bis(3'-(N,N-dimethylamino)propyl)-2,7-fluorene)-alt-2,7-(9,9-dioctylfluorene)] at Ossila. By using new interface materials and architectures, the PCE of PTB7 (Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophene-diyl]]) is able to reach about 9%. However, the cost and the synthetic methodology for these polymers are not yet favorable for mass production and commercialization. As such, further improvements are still needed in order to provide ease of processing, higher performance, and lower production cost.

Polythiophene is one of the well-known electrically conducting polymers and it has been an important material for applications in photovoltaic cells, photochemical resists, light emitting diodes, and thin film transistors. For examples, both native polythiophene and regio-regular polythiophenes are well-known conducting polymers for the applications in the fields of energy saving devices.

However, the syntheses of polythiophenes and regio-regular polythiophenes involve lengthy and complicated processes, and cast hindrance for future scale-up and production. Also, solubility is a big problem for solution process of polythiophene.

For example, the most common regio-regular polythiophenes polymer, poly(3-hexylthiophene (P3HT), has reasonable solubility but its production cost is very high and thus limits its applications for organic device fabrication. On the other hand, native polythiophene is cheap but unfortunately it is not soluble in both organic and aqueous solvents. This implies that the native polythiophene is difficult to be processed and thus limit many of its potential applications.

SUMMARY OF INVENTION

In the light of the foregoing background, it is an object of the present invention to provide a new polymer, which can be obtained through a cost-effective functionalization process and soluble in most commonly used organic solvents. Accordingly, the present invention, in one aspect, provides a compound of formula I,

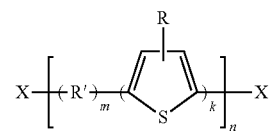

wherein X is selected from the group consisting of hydrogen, bromine, chlorine, and methyl group;
m is equal or great than zero;
k is equal or great than one;
n is equal or great than one;
R is $NR^1R^2$, or selected from the group consisting of hydrogen, alkoxy group, and substituted alkoxy group;
wherein $R^1$ and $R^2$ are independently selected from the group consisting of hydrogen, aldehyde, acid chloride, acid bromide, and isocyanate; and
R' is selected from the group consisting of aryl, and substituted aryl.

In an exemplary embodiment of the present invention, wherein said compound is represented by formula Ia,

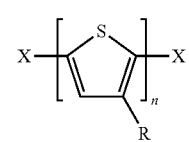

wherein R is $NR^1R^2$ or an alkoxy group, said alkoxy group is further selected from the group consisting of propanols, butanols, pentanols, hexanols, ethyl formate, substituted ethyl formate, ethoxy silane, and substituted ethoxy silane.

In an exemplary embodiment of the present invention, wherein said compound is represented by formula Ib,

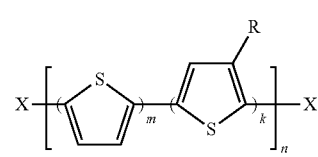

wherein R is $NR^1R^2$ or an alkoxy group, said alkoxy group is further selected from the group consisting of ethanol, substituted ethanol, ethyl formate, substituted ethyl formate, ethoxy silane, and substituted ethoxy silane.

In an exemplary embodiment of the present invention, wherein said compound is represented by formula Ic,

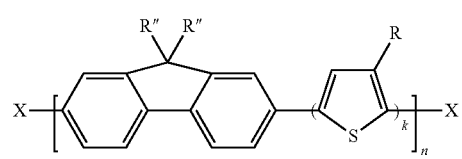

wherein R" is hydrogen or alkyl chain comprising $C_6H_{13}$, $C_8H_{17}$, and $C_{12}H_{25}$; and R is $NR^1R^2$ or an alkoxy group, said alkoxy group is further selected from the group consisting of ethanol, substituted ethanol, ethyl formate, substituted ethyl formate, ethoxy silane, and substituted ethoxy silane.

In an exemplary embodiment of the present invention, wherein said compound is represented by formula Ic',

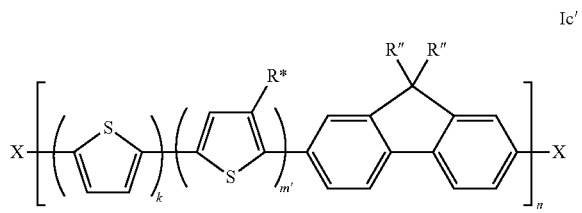

wherein m' is equal or greater than one;

R* is selected from the group consisting of ethanol, substituted ethanol, ethyl formate, substituted ethyl formate, ethoxy silane, and substituted ethoxy silane;

R" is hydrogen or alkyl chain comprising $C_6H_{13}$, $C_8H_{17}$, and $C_{12}H_{25}$.

In an exemplary embodiment of the present invention, wherein said compound is represented by formula Id,

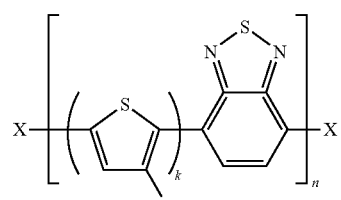

wherein R is $NR^1R^2$ or an alkoxy group, said alkoxy group is further selected from the group consisting of ethanol, substituted ethanol, ethyl formate, substituted ethyl formate, ethoxy silane, and substituted ethoxy silane.

In an exemplary embodiment of the present invention, wherein said compound is represented by formula Ie,

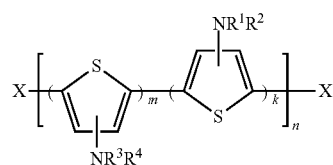

wherein m is equal or great than one; and $R^3$ and $R^4$ are independently selected from the group consisting of hydrogen, aldehyde, acid chloride, acid bromide, and isocyanate.

In an exemplary embodiment of the present invention, wherein said aldehyde is an aliphatic aldehyde selected from the group consisting of acetaldehyde, propionaldehyde, butyraldehyde, and valeraldehyde; or an aromatic aldehyde selected from the group consisting of cinnamaldehyde. Said aldehyde is present in any one of the compounds represented by formulae I, Ia, Ib, Ic, Ic', Id, or Ie.

In an exemplary embodiment of the present invention, wherein said acid chloride is an aliphatic acid chloride selected from the group consisting of acetyl chloride, propanoyl chloride, butanoyl chloride, and pentanoyl chloride; or an aromatic acid chloride selected from the group consisting of benzoyl chloride, p-toluoyl chloride, 4-tert-butylbenzoyl chloride, and 4-(chloromethyl)benzoyl chloride. Said acid chloride is present in any one of the compounds represented by formulae I, Ia, Ib, Ic, Ic', Id, or Ie.

In an exemplary embodiment of the present invention, wherein said acid bromide is an aliphatic acid bromide selected from the group consisting of acetyl bromide, propanoyl bromide, butanoyl bromide, and pentanoyl bromide; or an aromatic acid bromide selected from the group consisting of p-toluoyl bromide, 4-tert-butylbenzoyl bromide, and 4-(chloromethyl)benzoyl bromide. Said acid bromide is present in any one of the compounds represented by formulae I, Ia, Ib, Ic, Ic', Id, or Ie.

In an exemplary embodiment of the present invention, wherein said isocyanate is an aliphatic isocyanate selected from the group consisting of ethyl isocyanate, isopropyl isocyanate, propyl isocyanate, sec-butyl isocyanate, 1-isocyanatobutane, and 2-ethylhexyl isocyanate; or an aromatic isocyanate selected from the group consisting of p-tolyl isocyanate, 4-ethylphenyl isocyanate, and 4-nitrophenyl isocyanate. Said isocyanate is present in any one of the compounds represented by formulae I, Ia, Ib, Ic, Ic', Id, or Ie.

In an exemplary embodiment of the present invention, wherein said compound is represented by formula Ie',

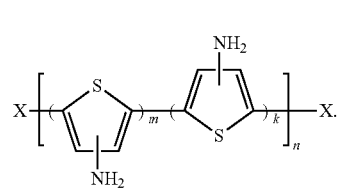

In an exemplary embodiment of the present invention, wherein said compound is selected from a group consisting of formulae (i)-(iii),

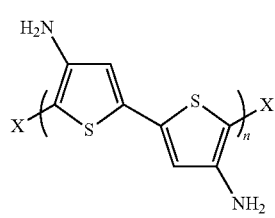

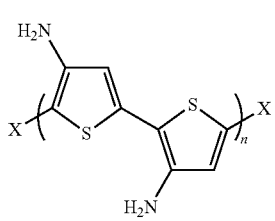

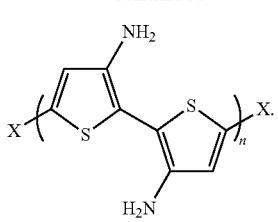

(iii)

In a further aspect of the present invention, a composition is provided, comprising at least one of the above mentioned compounds, represented by formulae I, Ia, Ib, Ic, Ic', Id, Ie, Ie', (i), (ii), or (iii), and/or solvents.

In an exemplary embodiment of the present invention, the solvent comprises an organic solvent selected from the group consisting of acetone, acetonitrile, tetrahydrofuran, ethyl acetate, toluene, benzene, methanol, ethanol, 1-propanol, iso-propanol, DMSO, DMF, and halogenated hydrocarbon solvent.

In an exemplary embodiment of the present invention, the solvent further comprises water.

In a further aspect of the present invention, use of the compound as mentioned above is disclosed, including fabricating conducting polymers for printed electronics devices, organic light emitting diodes (OLEDs), light emitting diodes (PLEDs) and organic photovoltaic devices (OPVs) applications; or preparing light absorbing materials or donor materials for organic photovoltaic devices (OPVs) applications.

In a further aspect of the present invention, use of the composition as mentioned above is disclosed, including fabricating conducting polymers for printed electronics devices, organic light emitting diodes (OLEDs), light emitting diodes (PLEDs) and organic photovoltaic devices (OPVs) applications; or preparing light absorbing materials or donor materials for organic photovoltaic devices (OPVs) applications.

In a further aspect of the present invention, a conductive polymer is provided, comprising at least a compound as mentioned above, represented by formulae I, Ia, Ib, Ic, Ic', Id, Ie, Ie', (i), (ii), or (iii).

In a further aspect of the present invention, a solution is provided, comprising at least a compound as mentioned above, represented by formulae I, Ia, Ib, Ic, Ic', Id, Ie, Ie', (i), (ii), or (iii), wherein said solution is adapted for using or making a thin film on a substrate.

In an exemplary embodiment of the present invention, the solution is adapted for fabrication of a layer by using spin coating process or roll-to-roll process; wherein said layer is selected from the group consisting of a thin layer on a LED device as an active layer, a conductive layer for thermal management, and an active light absorption layer on an organic photovoltaic solar device.

In a further aspect of the present invention, an ink formulation is provided, comprising at least a compound as mentioned above, represented by formulae I, Ia, Ib, Ic, Ic', Id, Ie, Ie', (i), (ii), or (iii), wherein said ink formulation is adapted for using or making a thin film on printed electronic devices.

In an exemplary embodiment of the present invention, the solution, the ink formulation is adapted for fabrication of a layer by using spin coating process or roll-to-roll process; wherein said layer is selected from the group consisting of a thin layer on a LED device as an active layer, a conductive layer for thermal management, and an active light absorption layer on an organic photovoltaic solar device.

DETAILED DESCRIPTION OF THE PREFERRED EMBODIMENTS

Figure 1:
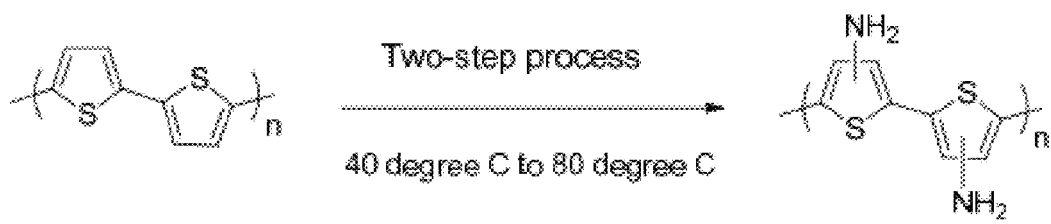
FIG. 1 shows the fabrication process for the $NH_2$-functionalized polythiophene according to one embodiment of the present invention. The resulting $NH_2$-functionalized polythiophene is soluble in organic solvents and is processable for reforming and thin film formation for devices.

As used herein and in the claims, "comprising" means including the following elements but not excluding others.

The present invention relates to new functionalized polythiophene compound. In particular, amine group directly bonds to the thiophene repeating unit of the polythiophene compound. The amine group allows ease of further functionalization to prepare new polymer derivatives with different chemical and physical properties. These new functionalized polythiophenes and their derivatives can be used for the fabrications of organic light emitting diodes (OLEDs), polymer light emitting diodes (PLEDs), organic photovoltaic devices (OPVs) and conducting polymers for printed electronic devices. The amine-functionalized polythiophene is soluble in commonly used organic solvents including acetone, ethyl acetate, ethanol, and toluene, etc. The resulting solution amine-functionalized polythiophene is processable and suitable for printing thin-films in the field of printed electronics and roll-to-roll processing.

Another aspect of the present invention discloses a new low-cost methodology to functionalize the native polythiophene through simple and mild chemical processes to produce new polythiophene compounds. The process is able to be scaled up for large production. The new compounds are soluble in common organic solvents including acetone, acetonitrile, tetrahydrofuran, ethyl acetate, chloroform, toluene, methanol, ethanol, 1-propanol, isopropanol, DMSO, DMF, other halogenated hydrocarbon solvents and etc.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

Fabrication processes are described in Examples 1-9 below. Referring now to FIGS. 1-5, the present invention discloses the fabrication processes and UV-vis absorption spectrum of solution processable polythiophene.

Example 1

Fabrication of $NH_2$-Functionalized Polythiophene

Polymerization of Thiophene 50 ml acetonitrile was cooled in a flask in an ice bath. 38.44 g of anhydrous $FeCl_3$ were added to the flask. 5 g of thiophene and 20 ml acetonitrile were added to another flask in a 40° C. water bath. $FeCl_3$ solution was added to the thiophene solution drop by drop. The mixture was kept in a water bath at 40° C. for overnight. The resulting mixture was filtered and the dark reddish solid was collected. The solid was washed with methanol and then water. Reddish brown solid obtained. The compound was characterized by UV-vis. The process is summarized in Equation (1) below.

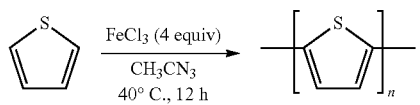

Observation: Solid is not soluble ethanol, ethyl acetate, acetone, etc. It is slightly soluble in hot dichlorobenzene.

Step 1: Nitration of Polythiophene to $NO_2$-polythiophene ($NO_2$-PT)

$HNO_3$ (8 ml) and $H_2SO_4$ (20 ml) were put in an ice bath for 30 min. The two acids and 3 ml $H_2O$ were added to a flask with stirring in an ice bath and was kept for 30 min. Polythiophene (1 g) was added to the flask slowly. The mixture was then heated to 50° C. for 4 h after all solids were dissolved. The reaction mixture was then cooled to room temperature and then was poured to a beaker with ice-water slowly. Reddish brown precipitates were formed and the solid was filtered out. The compound was characterized by UV-vis. The process is summarized in Equation (2) below.

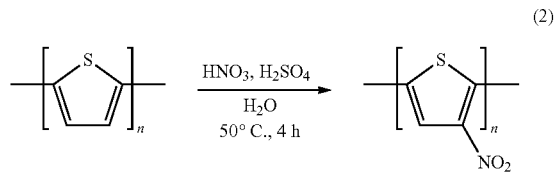

Observation: Reddish brown solid collected which was highly soluble in EtOH and acetone.

Figure 2:
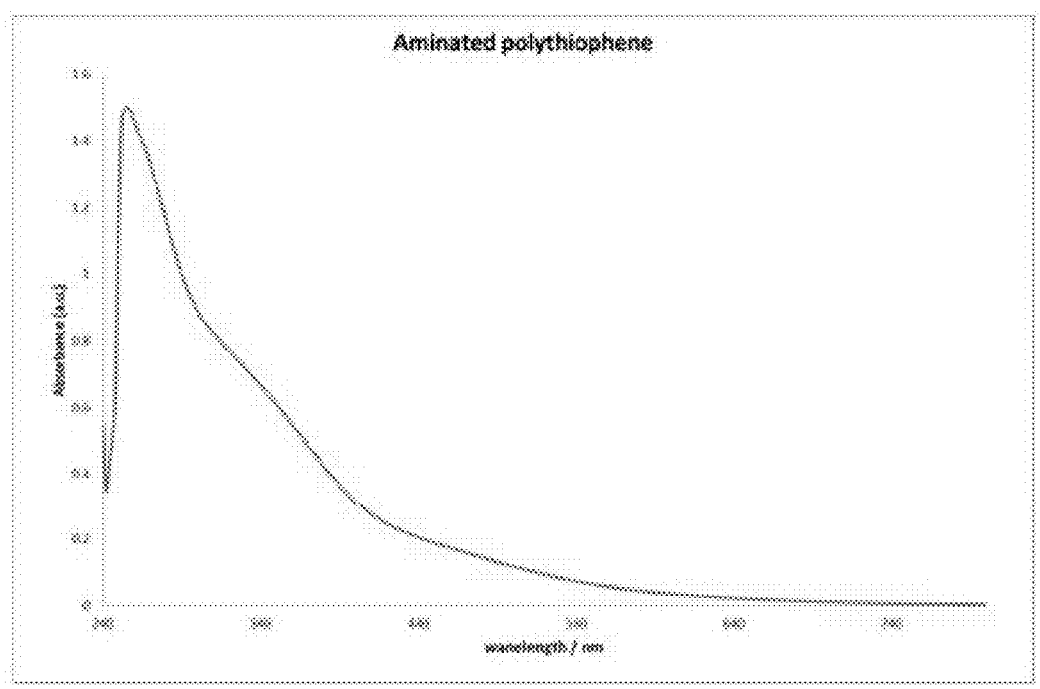
FIG. 2 shows the UV-vis absorption spectrum of the functionalized polythiophene according to the same embodiment of the present invention.
Figure 7:
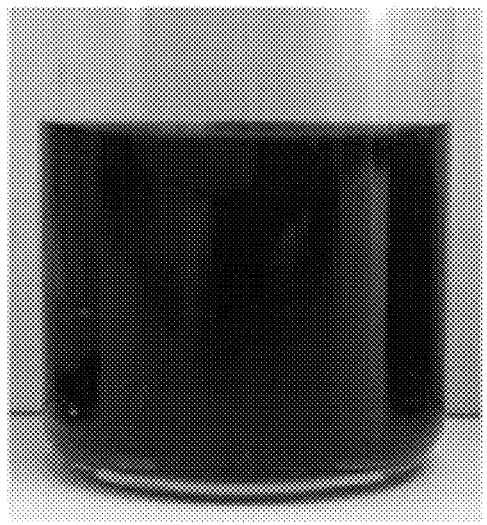
FIG. 7 shows the solubility of the $NH_2$-functionalized polythiophene obtained according to Example 1 of the present invention in (A) ethanol, (B) acetone, (C) ethyl acetate, and (D) toluene.
Figure 7:
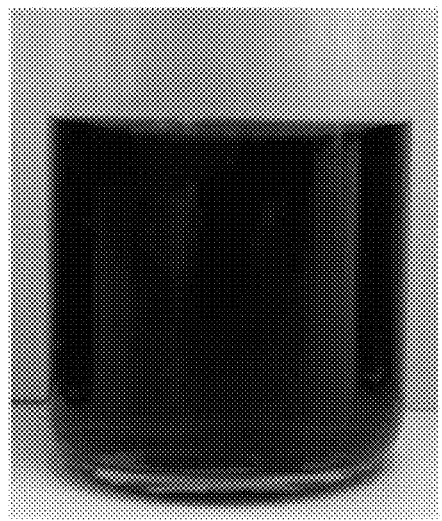
Figure 7:
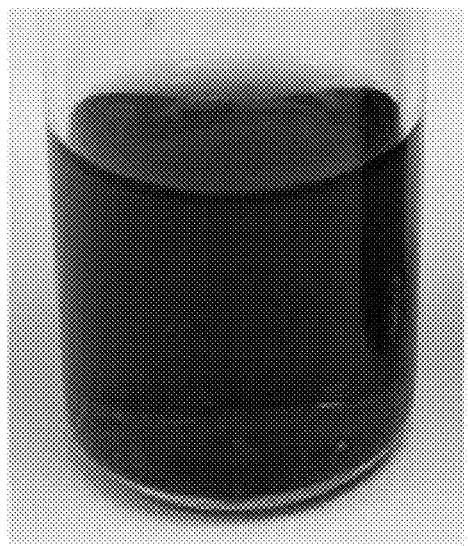
Figure 7:
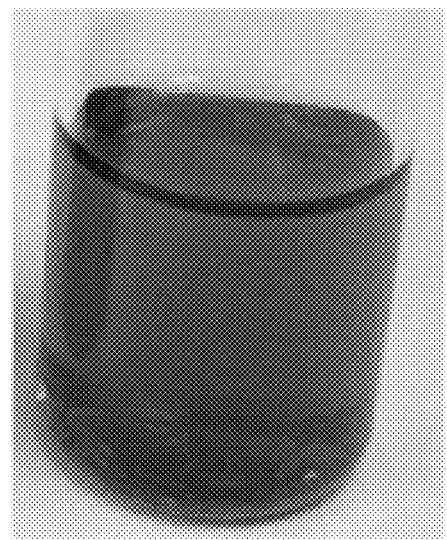

Step 2: Reduction of $NO_2$-Polythiophene to $NH_2$-Polythiophene $NO_2$-PT (0.2 g), Fe powder (0.3 g), $CaCl_2$ (0.2 g), EtOH (10 ml), and $H_2O$ (0.5 ml) were added to a flask. The mixture was stirred and heated to 78° C. for 2.5 h. The mixture was then cooled to room temperature and the reaction mixture was filtered. The filtrate was collected, extracted with ethyl acetate and then was washed with water. The organic phase was collected and recrystallized. Black solid was obtained. The compound was characterized by UV-vis, which is shown in FIG. 2, whereas the solubility test results are shown in FIG. 7.

Observation: Black solid collected which was soluble in ethanol, ethyl acetate, and acetone.

Example 2

Fabrication of Polythiophene 1

Step 1: Modification of Thiophene-3-Ethanol with Various Acyl Chlorides (where R can be any Alkyl Chains Comprising Methyl, Ethyl, Propyl, i-Propyl, Butyl, Etc.)

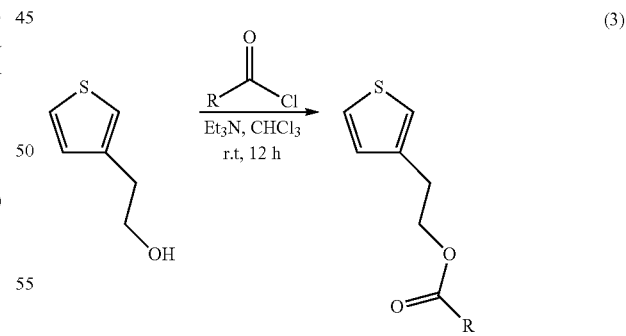

Procedures:
1. 1.0 ml of thiophene-3-ethanol was placed with 30 ml of $CHCl_3$, 4.96 ml of triethylamine and was cooled in ice-bath.
2. 3.1 ml of propionyl chloride was added to thiophene solution dropwise for 15 min.
3. The mixture was stirred at 0-2° C. for 2 h and then stirred at room temperature for 10 h and subsequently washed with DI water to obtain the product.

The process is summarized in Equation (3) above.

Step 2: Synthesis of Polythiophene 1 (where R can be any Alkyl Chains Comprising Methyl, Ethyl, Propyl, i-Propyl, Butyl, Etc.)

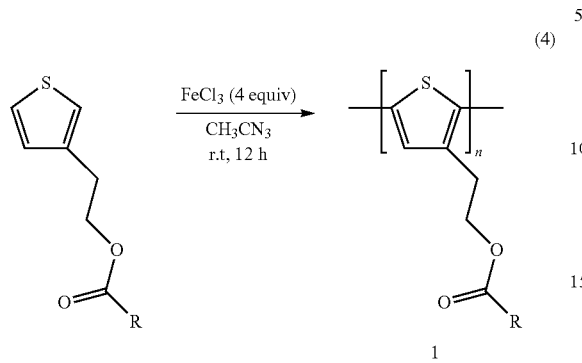

(4)

Procedures:

1. 50 ml acetonitrile was cooled in an ice-bath. FeCl$_3$ (6.8 g, 41.8 mmol) was added to the flask with stirring.

2. 2-(3-Thienyl)ethyl propanoate (1.9 g, 10.4 mmol) was dissolved in 20 mL acetonitrile and the solution was added to a dropping funnel.

3. The 2-(3-Thienyl)ethyl propanoate solution (monomer) was added to the cooled FeCl$_3$ solution dropwise for a period of 0.5 h.

4. The mixture was stirred at 0-2° C. for 2 h and then stirred at room temperature for 10 h.

5. The precipitate was filtrated and washed with DI water and MeOH.

6. The precipitate was poured into 12.5% of ammonium solution and stirred overnight at room temperature.

7. The precipitate was filtrated and washed with DI water and MeOH. The collected precipitate was poured into an aqueous solution of EDTA (pH=8) and stirred overnight at room temperature.

8. The precipitate was then filtrated and washed with DI water and MeOH.

The process is summarized in Equation (4) above.

Figure 3:
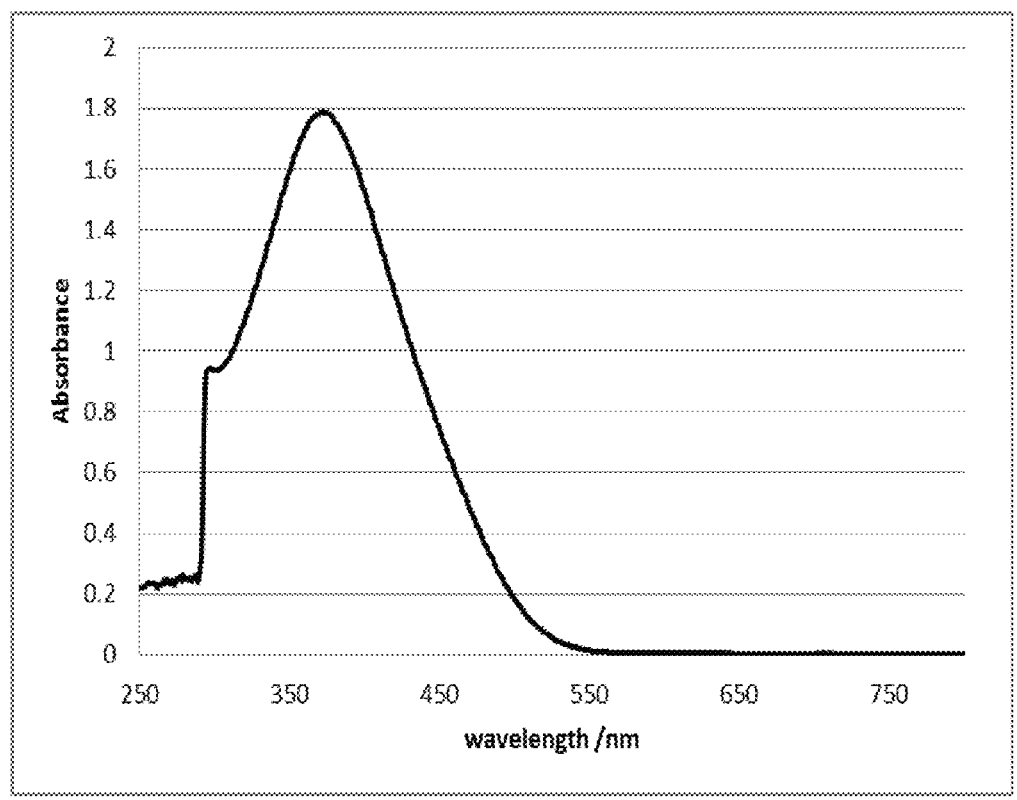
FIG. 3 shows the UV-vis absorption spectrum of polythiophene 1 (where R is ethyl).
Figure 8:
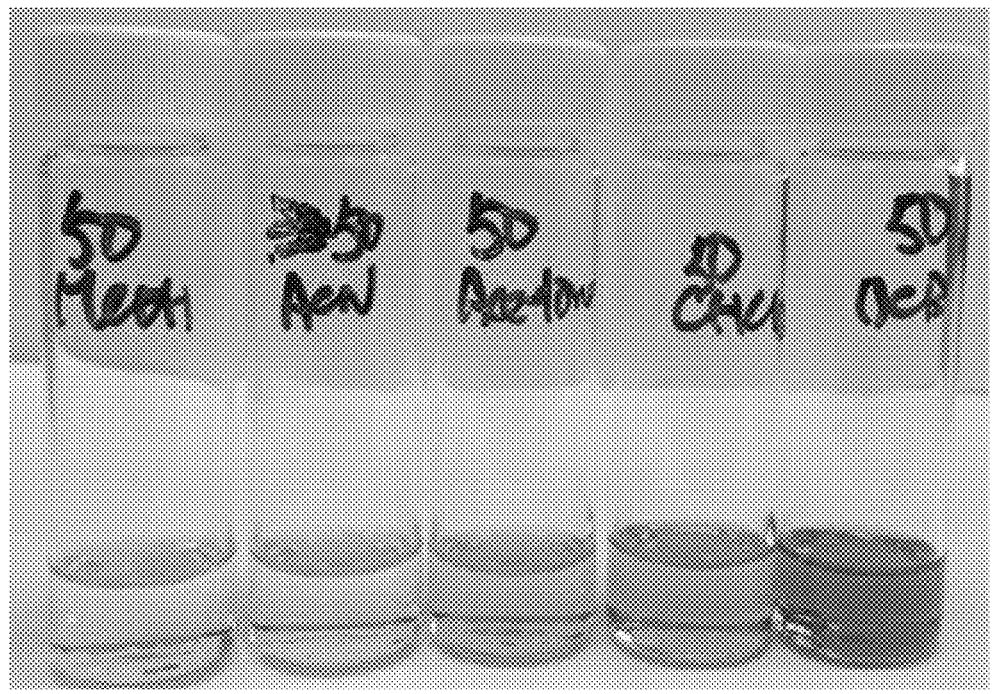
FIG. 8 shows the solubility of polythiophene 1 in (A) methanol, (B) acetonitrile, (C) acetone, (D) chloroform, and (E) 1,2-dichlorobenzene according to one embodiment of the present invention

The UV-vis spectrum of polythiophene 1 obtained is shown in FIG. 3, whereas the solubility test results are shown in FIG. 8 and summarized in Table 1 below, in which the R group is ethyl group in this specific embodiment of polythiophene 1.

As observed from Table 1, polythiophene 1 is soluble in acetone, chloroform, and 1,2-dichlorobenzene.

TABLE 1

| Sample | Solvent | Solubility, g/ml at 23° C. |
|--------|---------|-----------------------------|
| A | Methanol | Insoluble |
| B | Acetonitrile | Insoluble |
| C | Acetone | 0.43 mg/mL |
| D | Chloroform | 0.93 mg/mL |
| E | 1,2-Dichlorobenzene | 1.03 mg/mL |

Example 3

Fabrication of Silyl-Polythiophene

Step 1: Modification of Thiophene-3-Ethanol with Various Silyl Chlorides ((R)$_3$—Si—Cl, where R$^1$, R$^2$, and R$^3$ can be any Alkyl Chains Comprising Methyl, Ethyl, Propyl, i-Propyl, Butyl, Etc.)

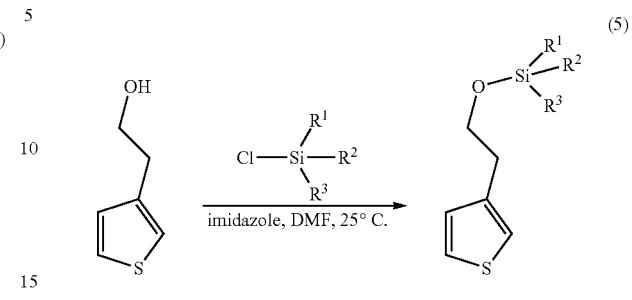

(5)

Procedures:

1. Imidazole (4.9 g, 73.0 mmol) was added to a solution of 6.0 g (21.0 mmol) of 2-hydroxyethylthiophene in 60 mL of DMF, and the resulting mixture was stirred at room temperature for 15 min.

2. The reaction was followed by addition of 5.2 g (34.4 mmol) of silyl chlorides in 10 mL of DMF.

3. The reaction mixture was stirred for 16 h at room temperature, and then was poured into a water-ice solution. The solution was extracted with hexane (360 mL). The organic fraction is washed with water and dry over Na$_2$SO$_4$.

4. Concentration in vacuum affords crude product which was purified by column chromatography on silica gel as colorless oil.

The process is summarized in Equation (5) above.

Step 2: Synthesis of Silyl-Polythiophene (where R can be any Alkyl Chains Comprising Methyl, Ethyl, Propyl, i-Propyl, Butyl, Etc.)

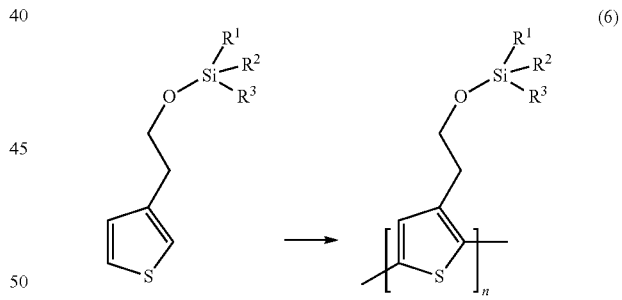

(6)

The polymerization procedure was the same as described in step 2 in Example 2. The process is summarized in Equation (6) above.

Example 4

Fabrication of New Polythiophene with Mixed-Blocks 4.1 Synthesis of Polythiophene 2 Using Thiophene Monomer (A) and 3-Alkyl-Substituted Thiophene Monomer (B) (where R can be any Alkyl Chains Comprising Methyl, Ethyl, Propyl, i-Propyl, Butyl, Etc.)

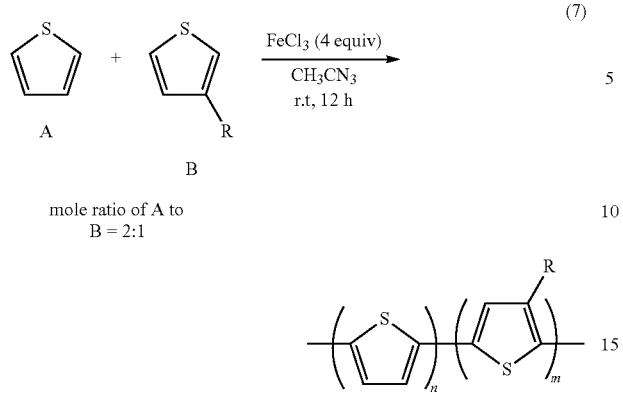

(7)

mole ratio of A to B = 2:1

Procedures:

1. 50 ml acetonitrile was cooled in an ice-bath. FeCl$_3$ (5.3 g 32.8 mmol) was added to the flask with stirring.

2. Thiophene A (444 uL, 5.54 mmol) and 3-methylthiophene (268 uL, 2.77 mmol) B were dissolved in 20 mL of acetonitrile and added to a dropping funnel.

3. The solution of the mixed thiophene monomers was added to FeCl$_3$ solution dropwise for a period of 0.5 h.

4. The mixture was stirred at 0-2° C. for 2 h and then stirred at room temperature for 10 h.

5. The precipitate was filtrated and washed with DI water and MeOH.

6. The precipitate was poured into 12.5% of ammonium solution and stirred overnight at room temperature.

7. The precipitate was filtrated and washed with DI water and MeOH. The collected precipitate was then poured into an aqueous solution of EDTA (pH=8) and stirred overnight at room temperature.

8. The precipitate was filtrated and washed with DI water and MeOH.

The process is summarized in Equation (7) above. The UV-vis spectrum of polythiophene 2 obtained was shown in FIG. 4.

Figure 4:
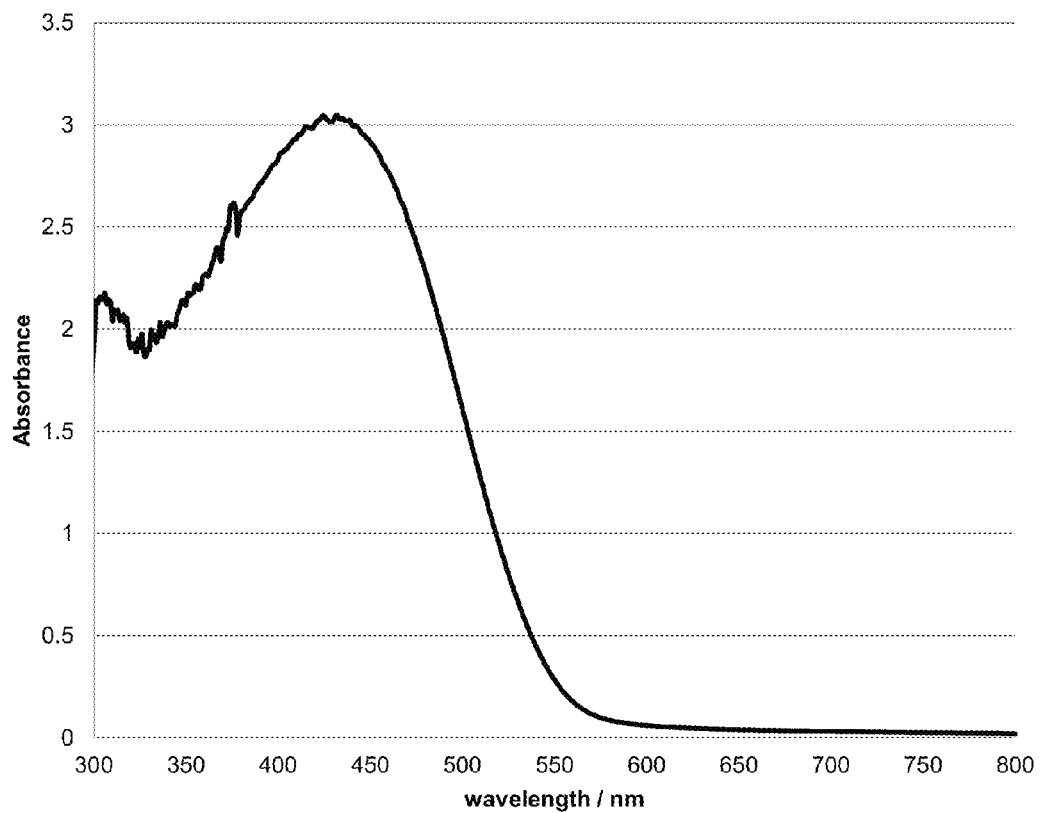
FIG. 4 shows the UV-vis absorption spectrum of polythiophene 2.
Figure 9:
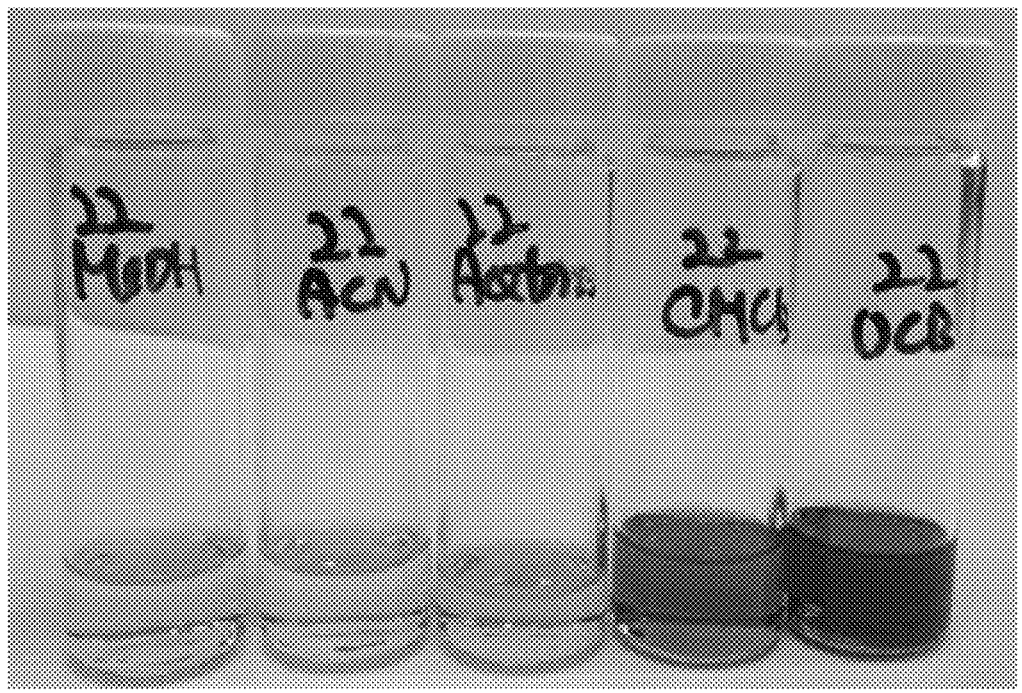
FIG. 9 shows the solubility of polythiophene 2 in (A) methanol, (B) acetonitrile, (C) acetone, (D) chloroform, and (E) 1,2-dichlorobenzene according to one embodiment 190 of the present invention.

The UV-vis spectrum of polythiophene 2 obtained is shown in FIG. 4, whereas the solubility test results are shown in FIG. 9 and summarized in Table 2 below, in which the R group is methyl group, n is greater than 1 and m is greater than 1.

As observed from Table 2, polythiophene 2 is soluble in acetone, chloroform, and 1,2-dichlorobenzene.

TABLE 2

| Test number | Solvent | Solubility, mg/ml at 23° C. |
| --- | --- | --- |
| A | Methanol | Insoluble |
| B | Acetonitrile | Insoluble |
| C | Acetone | 0.07 mg/mL |
| D | Chloroform | 0.57 mg/mL |
| E | 1,2-Dichlorobenzene | 0.83 mg/mL |

4.2 Polymerization Using Thiophene Monomer (A) and Thiophene-3-Ethanol Monomer (B)

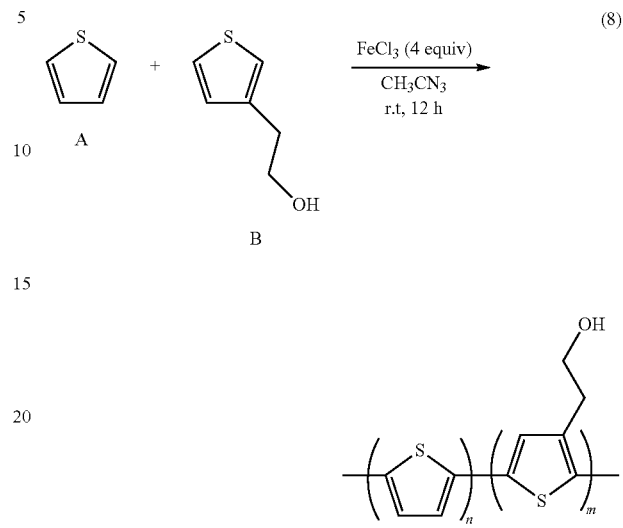

(8)

The polymerization procedure was the same as described in section 4.1 in Example 4. The process is summarized in Equation (8) above.

4.3 Synthesis Using Thiophene Monomer (A) and Thiophene-3-Ethyl-Ester Monomer (B) (Referring to Step 1 in Example 2, where R can be any Alkyl Chains Comprising Methyl, Ethyl, Propyl, i-Propyl, Butyl, Etc.)

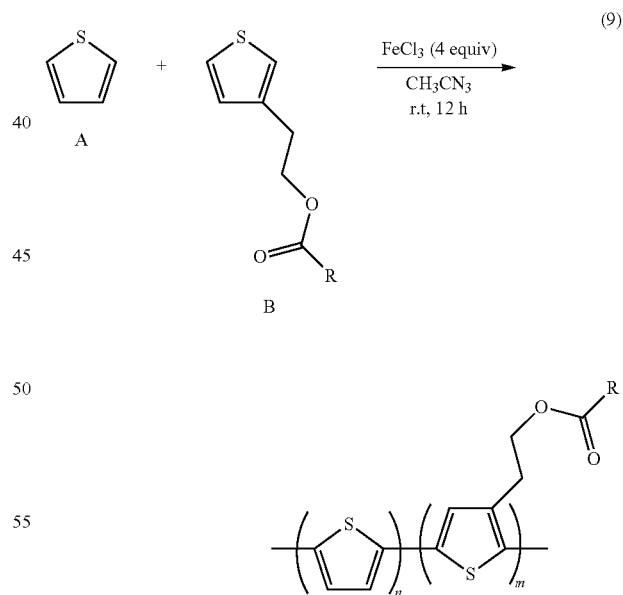

(9)

The synthesis procedure was the same as described in section 4.1 in Example 4. The process is summarized in Equation (9) above.

4.4 Synthesis Using Thiophene Monomer (A) and Thiophene-3-Ethyl-Silyl Monomer (B) (Referring to Step 1 in Example 3, where R$^1$, R$^2$, and R$^3$ can be any Alkyl Chains Comprising Methyl, Ethyl, Propyl, i-Propyl, Butyl, Etc.)

13

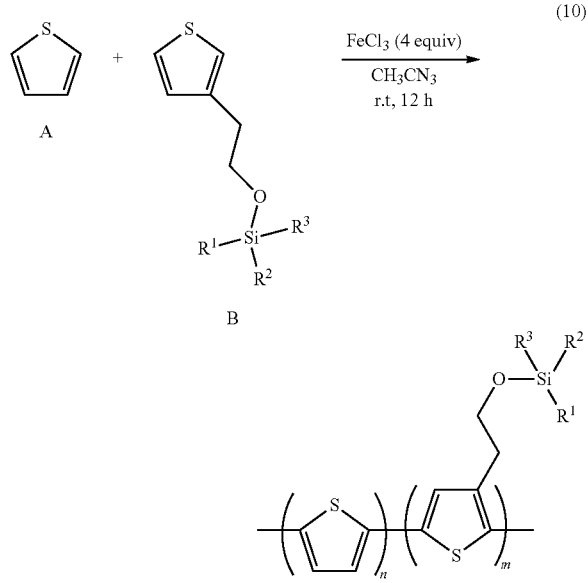

(10)

The synthesis procedure was the same as described in section 4.1 in Example 4. The process is summarized in Equation (10) above.

Example 5

Synthesis Using Polythiophene and 2,7-dibromo-9,9-dioctylfluorene

Step 1: Synthesis of Polythiophene 3

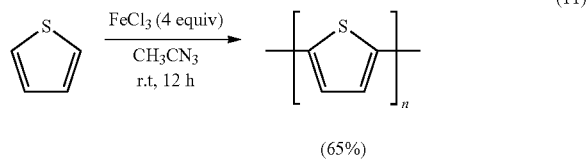

(11)

Procedures:

1. 50 m acetonitrile was cooled in an ice-bath. $FeCl_3$ (5.3 g, 32.8 mmol) was added to the flask with stirring.

2. Thiophene monomer (660 uL, 8.31 mmol) was dissolved in 20 mL acetonitrile and then was added to a dropping funnel.

3. The solution of the thiophene monomer was added to $FeCl_3$ solution dropwise in a period of 0.5 h.

4. The mixture was stirred at 0-2° C. for 2 h and then stirred at room temperature for 10 h.

5. The precipitate was filtrated and washed with DI water and followed by MeOH.

6. The precipitate was poured into 12.5% of ammonium solution and was stirred overnight at room temperature.

7. The precipitate was filtrated and washed with DI water and then MeOH. The collected precipitate was poured into an aqueous solution of EDTA (pH=8) and stirred overnight at room temperature.

8. The precipitate was filtrated and washed with DI water and MeOH.

The process is summarized in Equation (11) above.

14

Step 2: Coupling Reaction of Polythiophene 3 (where the Repeating Unit, n, is Greater than 6) with 2,7-Dibromo-9,9-Dialkylfluorene (where R' can be n-Alkyl Chain Comprising: $R'=C_6H_{13}$, or $C_8H_{17}$, or $C_{12}H_{25}$) or 2,7-Dibromofluorene (where $R'=H$)

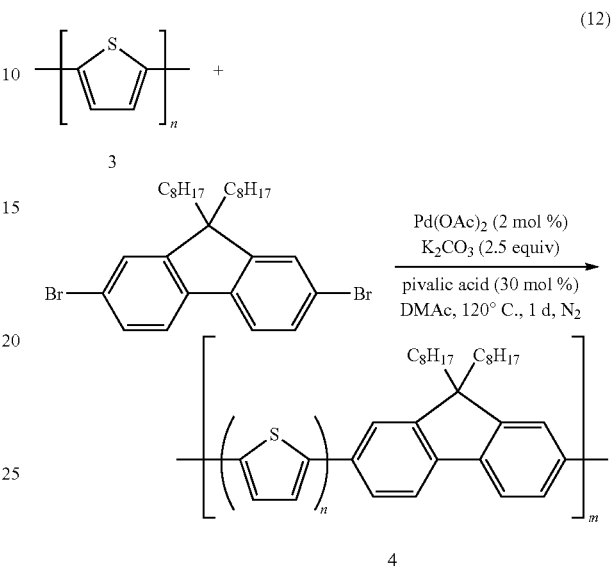

(12)

Procedures:

1. A mixture of $Pd(OAc)_2$ (2 mg), pivalic acid (10 uL), $K_2CO_3$ (87 mg), 2,7-dibromo-9,9-dioctylfluorene (137 mg), polythiophene 3 (124 mg) were stirred in dimethylacetamide for 1 d at 120° C. under nitrogen.

2. After cooling to room temperature, the mixture was poured into an aqueous solution of EDTA (pH=8).

3. The suspension was stirred overnight at room temperature.

4. The precipitate was filtrated and washed with 0.1 M HCl, then followed by DI water, MeOH and hexane successively.

5. The precipitate was dissolved in $CHCl_3$ and the solution was filtrated to remove the insoluble matters.

6. The Re-precipitation in $CHCl_3$/MeOH solution to obtain the product.

Figure 5:
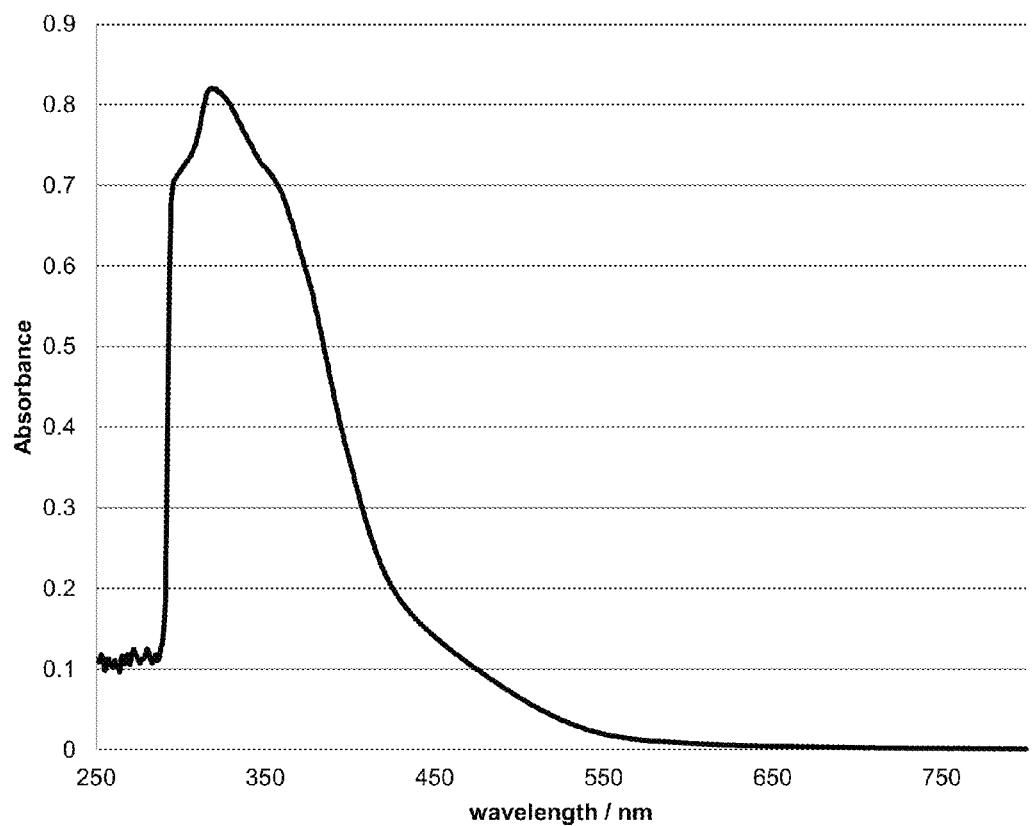
FIG. 5 shows the UV-vis absorption spectrum of polythiophene 4.
Figure 10:
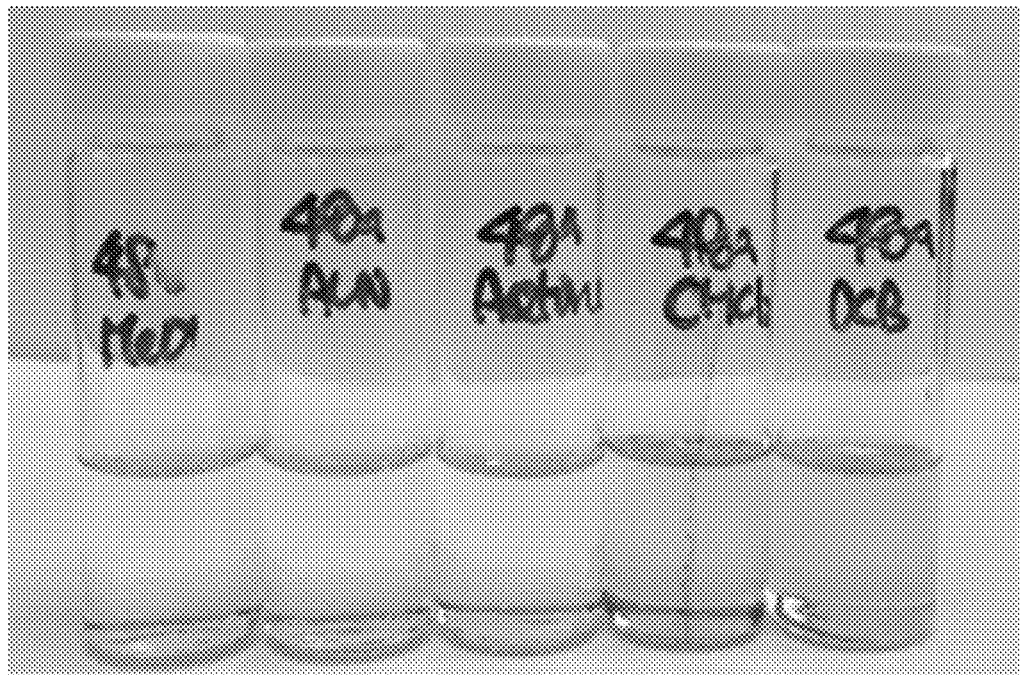
FIG. 10 shows the solubility of polythiophene 4 in (A) methanol, (B) acetonitrile, (C) acetone, (D) chloroform, and (E) 1,2-dichlorobenzene according to one embodiment of the present invention.
Figure 11:
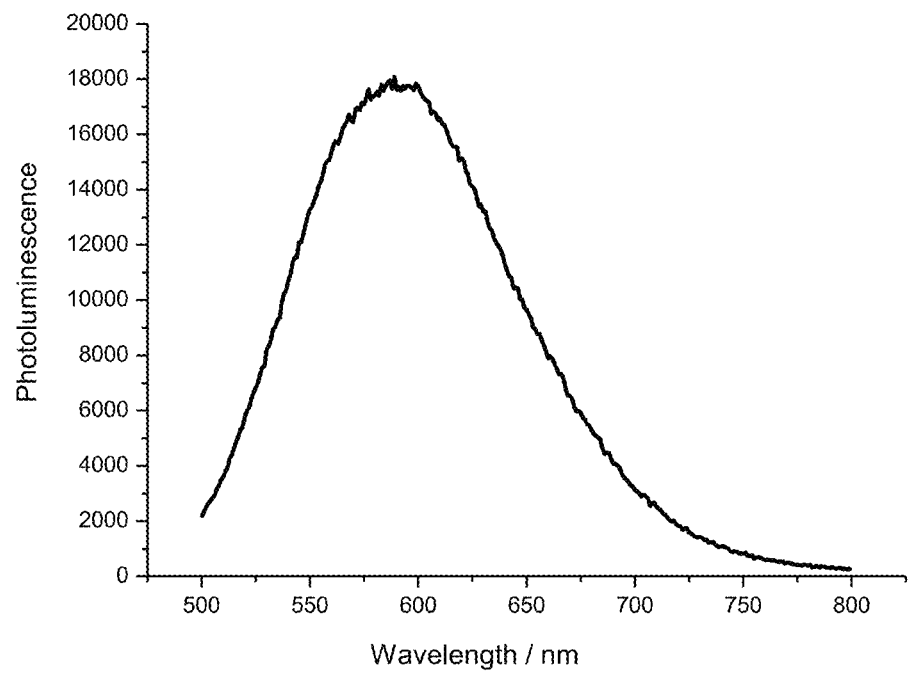
FIG. 11 shows the photoluminescence spectrum of polythiophene 12 in DMF.
Figure 12:
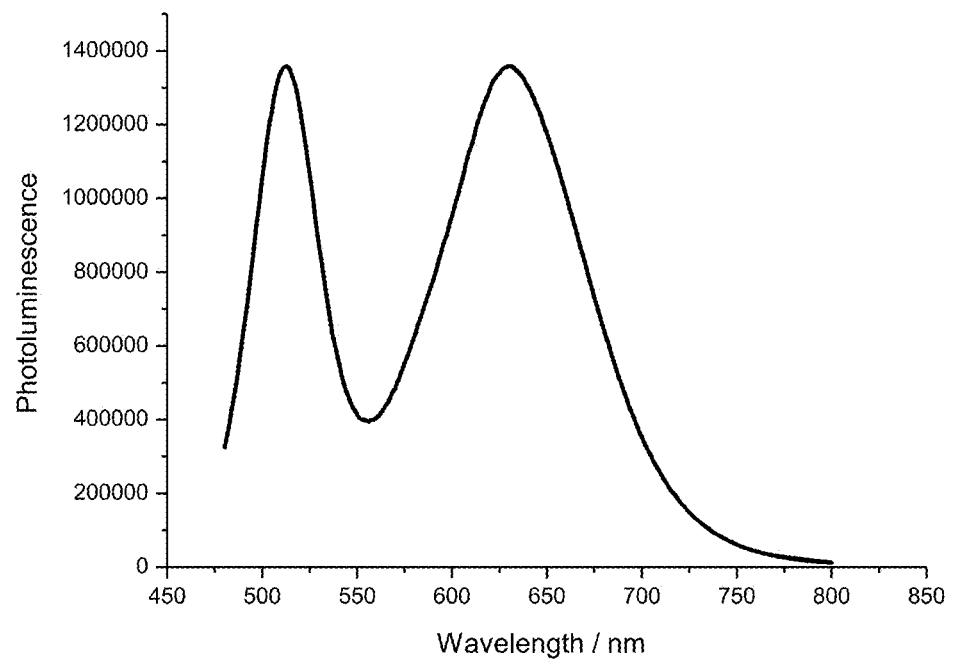
FIG. 12 shows the photoluminescence spectrum of polythiophene 13 in DMF.
Figure 13:
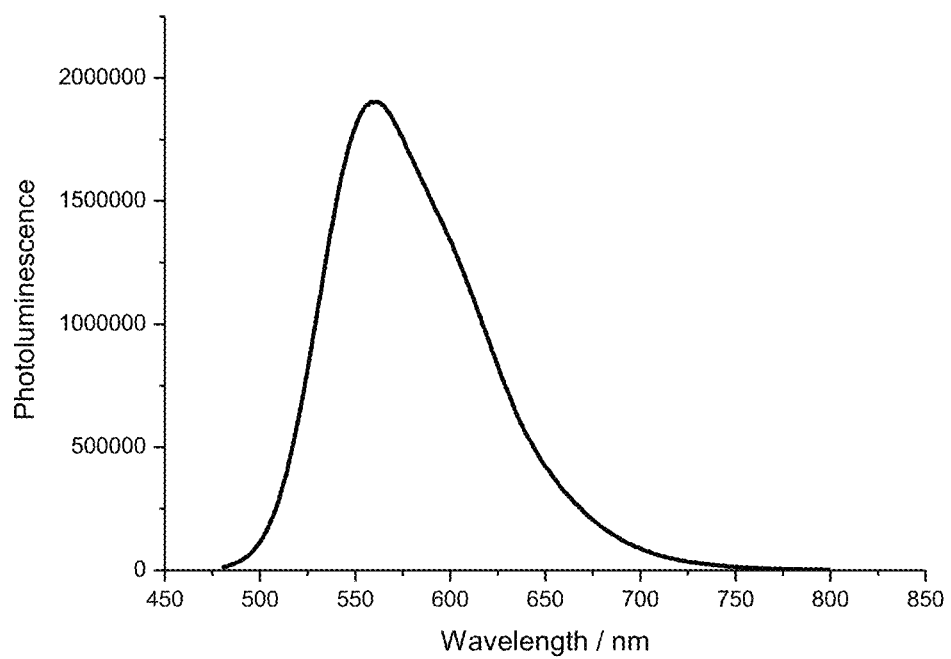
FIG. 13 shows the photoluminescence spectrum of polythiophene 14 in DMF.
Figure 14:
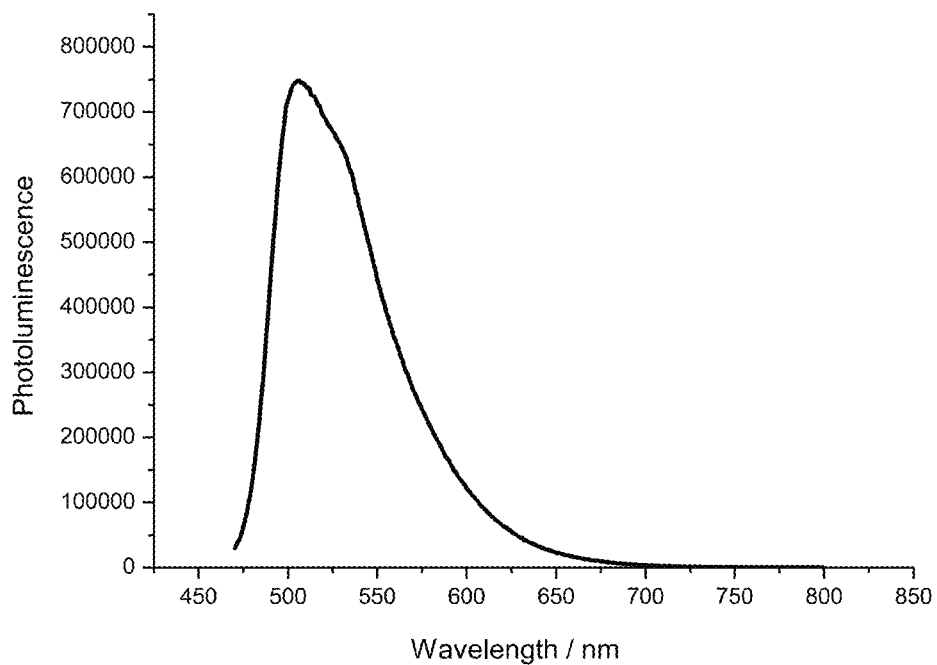
FIG. 14 shows the photoluminescence spectrum of polythiophene 15 in $CHCl_3$.
Figure 15:
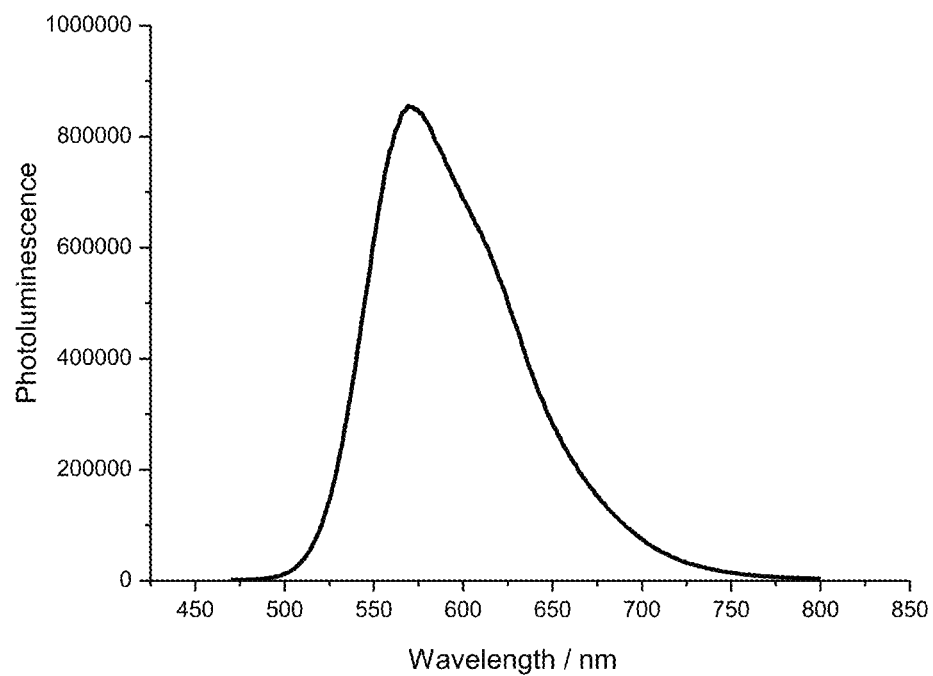
FIG. 15 shows the photoluminescence spectrum of polythiophene 16 in $CHCl_3$.
Figure 16:
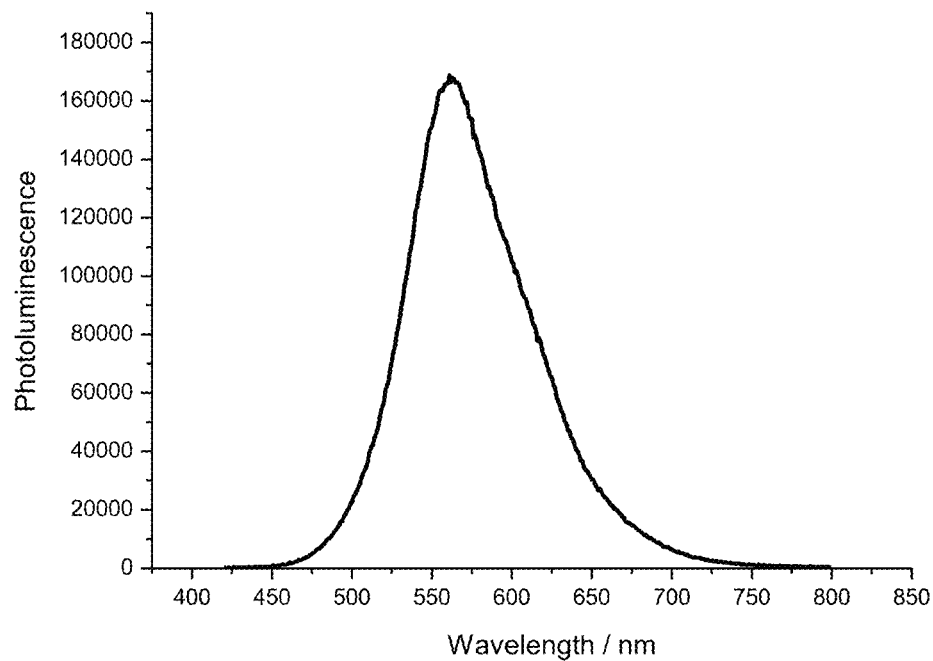
FIG. 16 shows the photoluminescence spectrum of polythiophene 17 in DCB.
Figure 17:
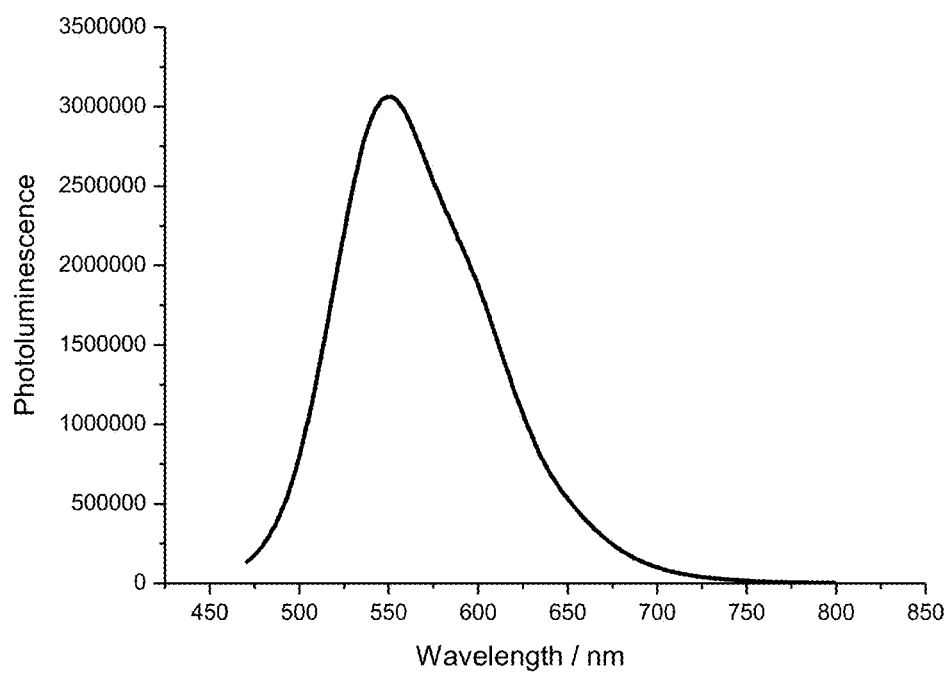
FIG. 17 shows the photoluminescence spectrum of polythiophene 18 in $CHCl_3$.
Figure 18:
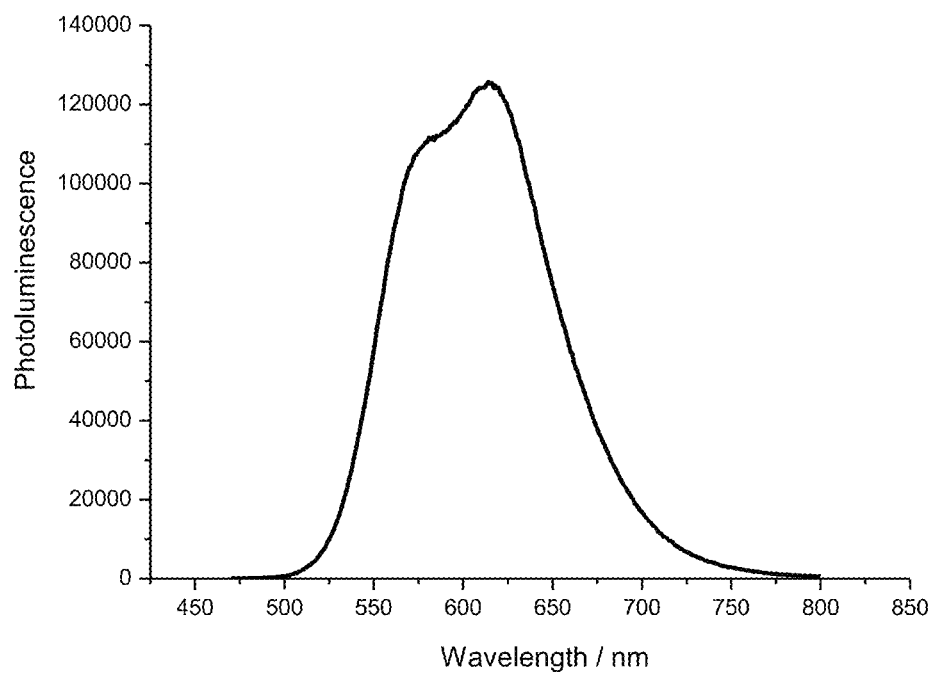
FIG. 18 shows the photoluminescence spectrum of polythiophene 19 in $CHCl_3$.

The process is summarized in Equation (12) above. The UV-vis spectrum of polythiophene 4 obtained was shown in FIG. 5. The UV-vis spectrum of polythiophene 4 obtained is shown in FIG. 5, whereas the solubility test results are shown in FIG. 10 and summarized in Table 3 below in which n is greater than 6 in this specific embodiment of polythiophene 4.

As observed from Table 3, polythiophene 4 is soluble in acetone, chloroform, and 1,2-dichlorobenzene.

TABLE 3

| Test number | Solvent | Solubility, g/ml at 23° C. |
|---|---|---|
| A | Methanol | Insoluble |
| B | Acetonitrile | Insoluble |
| C | Acetone | 0.07 mg/mL |
| D | Chloroform | 0.20 mg/mL |
| E | 1,2-Dichlorobenzene | 0.37 mg/mL |

Example 6

Synthesis Using 3-Substituted Polythiophene and 2,7-dibromo-9,9-Dialkylfluorene (where R' can be n-Alkyl Chain Comprising: R'=$C_6H_{13}$, or $C_8H_{17}$, or $C_{12}H_{25}$) or 2,7-Dibromofluorene (where R'=H)

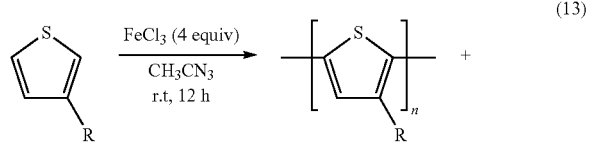

(13)

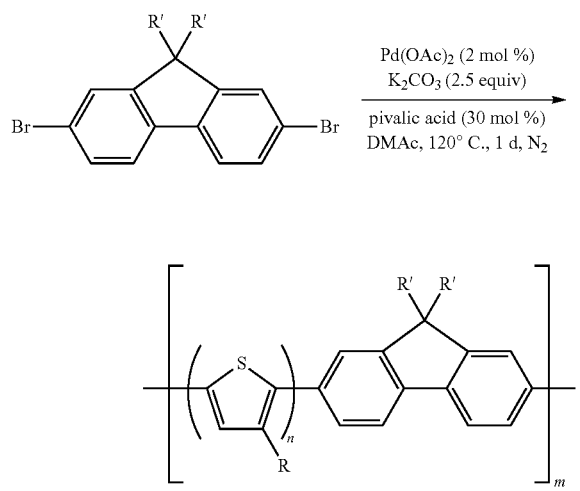

Step 1: Synthesis of 3-Substituted Polythiophene 5 (where the Repeating Unit, n, is Greater than 1.

(14)

Procedures:
1. 50 ml acetonitrile was cooled in an iced-bath. $FeCl_3$ (5.8 g, 35.7 mmol) was added to the flask with stirring.
2. Thiophene-3-ethanol monomer (1.0 mL, 8.9 mmol) was dissolved in 20 mL acetonitrile and added to a dropping funnel.
3. The thiophene solution was added to $FeCl_3$ solution dropwise over a period of 0.5 h.
4. The mixture was stirred at 0-2° C. for 2 h and then stirred at room temperature for 10 h.
5. The precipitate was filtered and washed with DI water and MeOH.
6. The precipitate was poured into 12.5% of ammonium solution and stirred overnight at room temperature.
7. The precipitate was filtered and washed with DI water and MeOH. The precipitate was poured into an aqueous solution of EDTA (pH=8) and stirred overnight at room temperature.
8. The precipitate was filtered and washed with DI water and MeOH.

The process is summarized in Equation (14) above.

Step 2: Coupling reaction of polythiophene 5 (where the repeating unit, n, is greater than 1) with 2,7-dibromo-9,9-dialkylfluorene (Where R' can be n-alkyl chain comprising: R'=$C_6H_{13}$, or $C_8H_{17}$, or $C_{12}H_{25}$) or 2,7-Dibromofluorene (where R'=H)

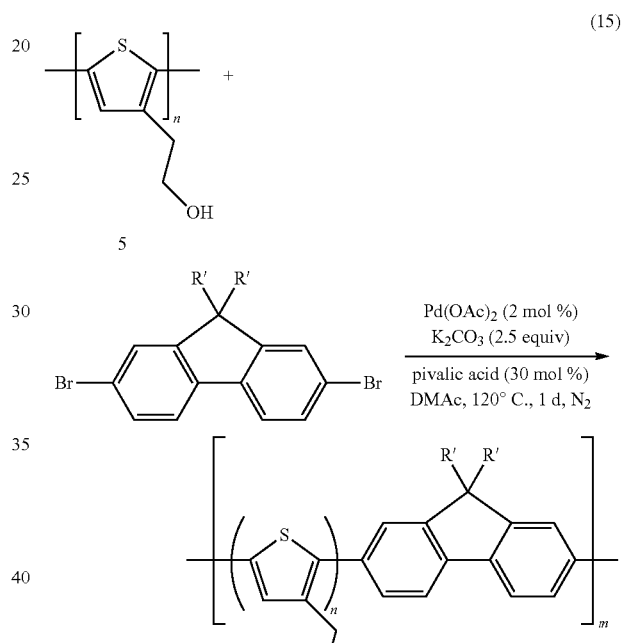

(15)

Procedures:
1. A mixture of $Pd(OAc)_2$ (2 mg), pivalic acid (10 uL), $K_2CO_3$ (87 mg), 2,7-dibromo-9,9-dioctylfluorene (137 mg), polythiophene 5 (124 mg) were stirred in dimethylacetamide for 1 d at 120° C. under $N_2$.
2. After cooling to room temperature, the mixture was poured into an aqueous solution of EDTA (pH=8).
3. The suspension was stirred overnight at room temperature.
4. The precipitate was filtered and washed with 0.1 M HCl, DI water, MeOH and hexane.
5. The precipitate was dissolved in $CHCl_3$ and the solution was filtered to remove the insoluble material.
6. Re-precipitation in a $CHCl_3$/MeOH solution to result in the product of polythiophene 6.

The process is summarized in Equation (15) above.

Example 7

Synthesis Using 3-Substituted Polythiophene (where R can be any Alkyl Chains Comprising Methyl, Ethyl, Propyl, i-Propyl, Butyl, Etc.) with 2,7-dibromo-9,9-dialkylfluorene (where R' can be n-Alkyl Chain Comprising: R'=$C_6H_{13}$, or $C_8H_{17}$, or $C_{12}H_{25}$) or 2,7-Dibromofluorene (where R'=H)

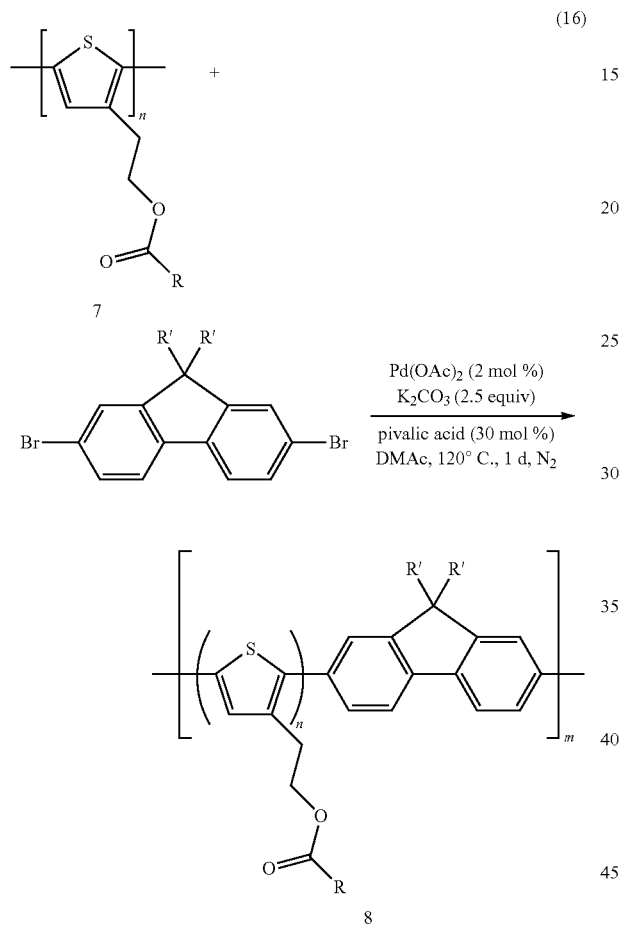

(16)

Procedures:

1. A mixture of Pd(OAc)$_2$ (2 mg), pivalic acid (10 uL), K$_2$CO$_3$ (87 mg), 2,7-dibromo-9,9-dioctylfluorene (137 mg), polythiophene 7 (124 mg) were stirred in dimethylacetamide for 1 d at 120° C. under N$_2$.

2. After cooling to room temperature, the mixture was poured into an aqueous solution of EDTA (pH=8).

3. The suspension was stirred overnight at room temperature.

4. The precipitate was filtrated and washed with 0.1 M HCl, DI water, MeOH and hexane.

5. The precipitate was dissolved in CHCl$_3$ and the solution was filtrated to remove the insoluble material.

6. Re-precipitation in a CHCl$_3$/MeOH solution to result in the product of polythiophene 8.

The process is summarized in Equation (16) above.

Example 8

Synthesis Using New Mix-Block Polythiophene with 2,7-Dibromo-9,9-Dialkylfluorene (where R' can be n-Alkyl Chain Comprising: R'=$C_6H_{13}$, or $C_8H_{17}$, or $C_{12}H_{25}$) or 2,7-Dibromofluorene (where R'=H)

8.1 Reaction of the New Mix-Block Polythiophene (Referring to Product of Example 4, where R can be any Alkyl Chains Comprising Methyl, Ethyl, Propyl, i-Propyl, Butyl, Etc.) and 2,7-Dibromo-9,9-Dialkylfluorene (where R' can be n-Alkyl Chain Comprising: R'=$C_6H_{13}$, or $C_8H_{17}$, or $C_{12}H_{25}$) or 2,7-Dibromofluorene (where R'=H).

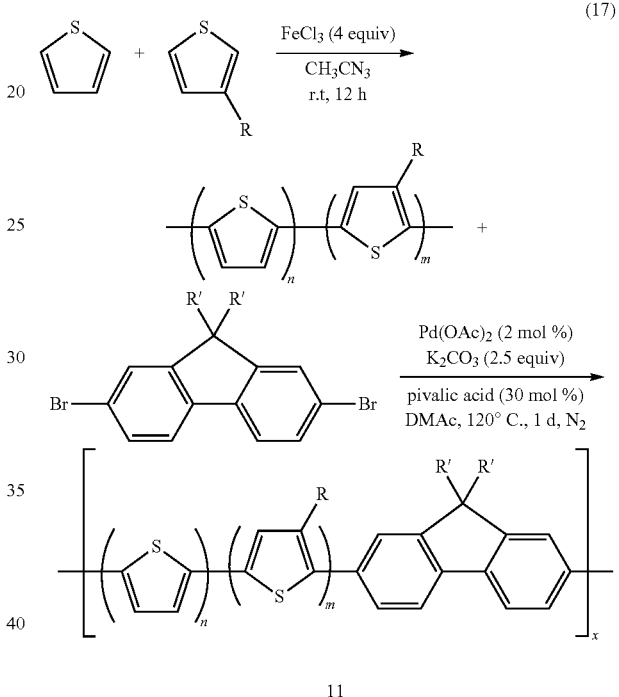

(17)

The process is summarized in Equation (17) above in which polythiophene 11 is obtained.

Figure 6:
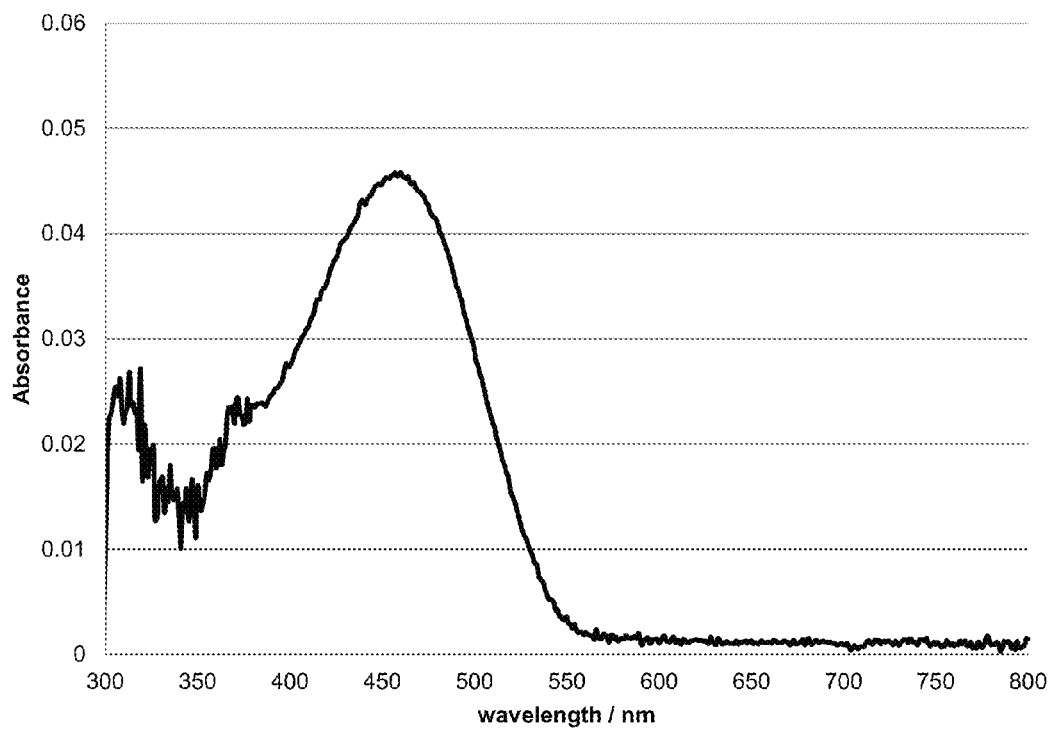
FIG. 6 shows the UV-vis absorption spectrum of polythiophene 11.

The UV-vis spectrum of a specific embodiment of polythiophene 11, in which R group is methyl, n is greater than 1, and m is greater than 1, is shown in FIG. 6.

8.2 Reaction of the New Mix-Block Polythiophene (Refer to the Product of Example 4) and 2,7-Dibromo-9,9-Dialkylfluorene (where R' can be n-Alkyl Chain Comprising: R'=$C_6H_{13}$, or $C_8H_{17}$, or $C_{12}H_{25}$) or 2,7-Dibromofluorene (where R'=H).

The process is summarized in Equation (18) above.

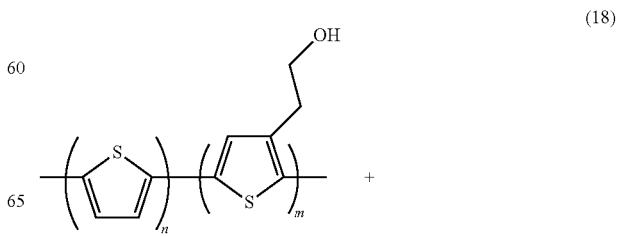

(18)

-continued

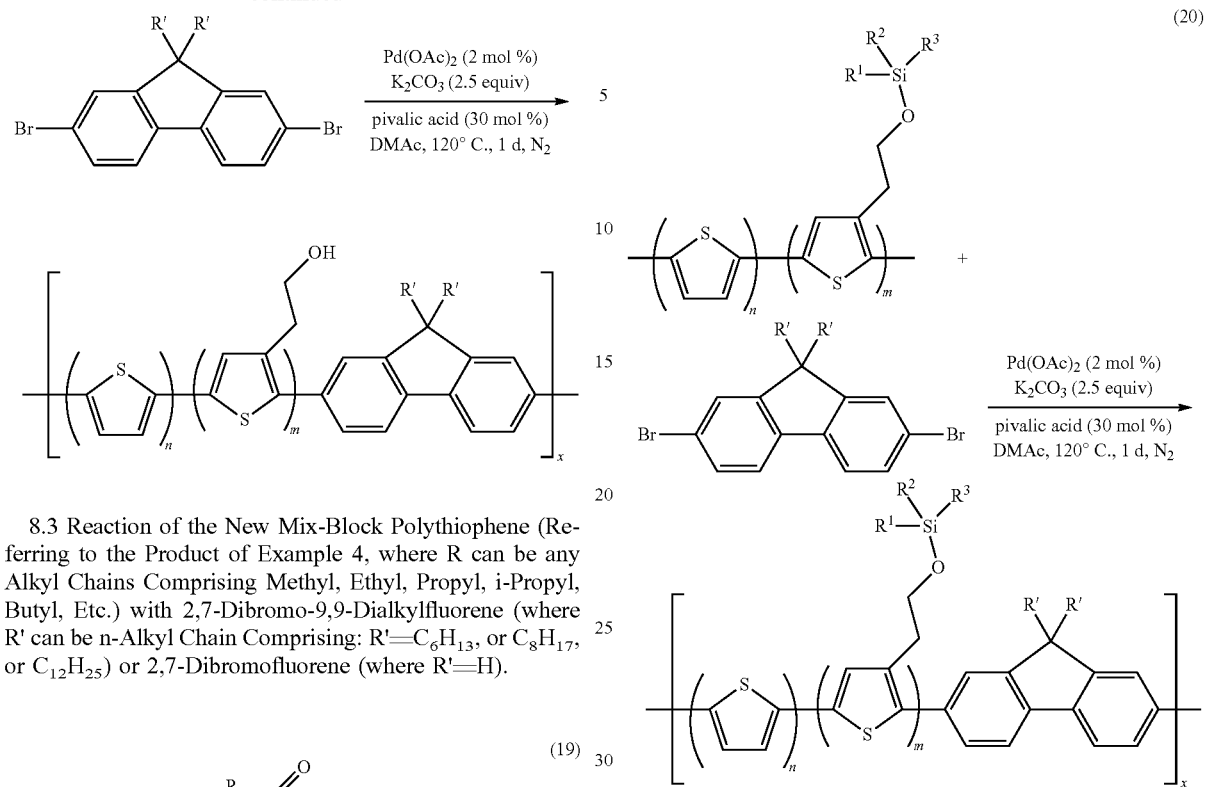

8.3 Reaction of the New Mix-Block Polythiophene (Referring to the Product of Example 4, where R can be any Alkyl Chains Comprising Methyl, Ethyl, Propyl, i-Propyl, Butyl, Etc.) with 2,7-Dibromo-9,9-Dialkylfluorene (where R' can be n-Alkyl Chain Comprising: R'=$C_6H_{13}$, or $C_8H_{17}$, or $C_{12}H_{25}$) or 2,7-Dibromofluorene (where R'=H).

The process is summarized in Equation (19) above.

8.4 Reaction of the New Mix-Block Polythiophene (Referring to the Product of Example 4, where $R^1$, $R^2$, and $R^3$ can be any Alkyl Chains Comprising Methyl, Ethyl, Propyl, i-Propyl, Butyl, Etc.) with 2,7-Dibromo-9,9-Dialkylfluorene (where R' can be n-Alkyl Chain Comprising: R'=$C_6H_{13}$, or $C_8H_{17}$, or $C_{12}H_{25}$) or 2,7-Dibromofluorene (where R'=H).

The process is summarized in Equation (20) above.

Example 9

Synthesis Using New Polythiophene (where R can be any Alkyl Chains Comprising Methyl, Ethyl, Propyl, i-Propyl, Butyl, Etc.) with Benzothiadiazole (BT)

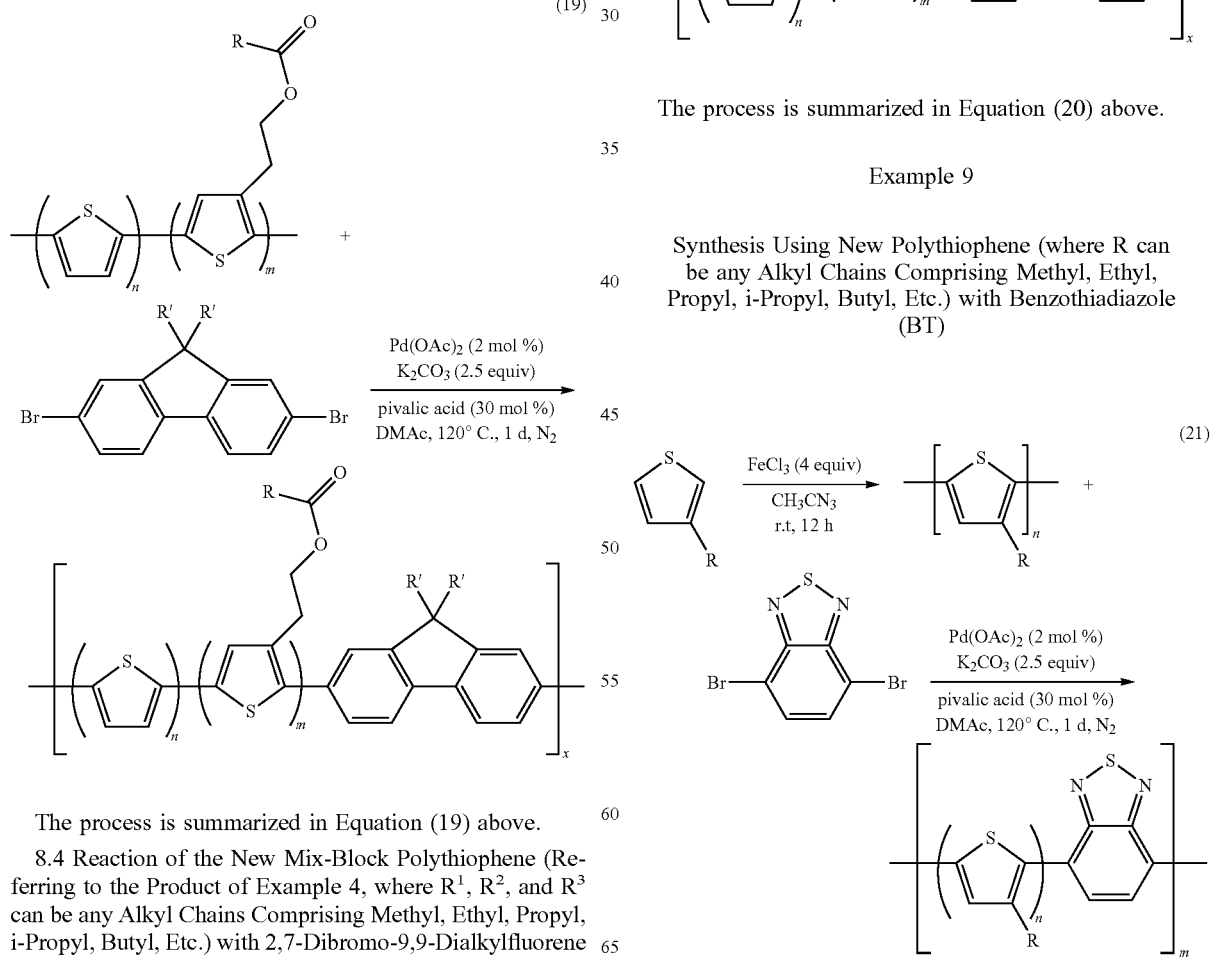

9.1 Coupling Reaction of New Polythiophene 5 with Benzothiadiazole (BT) to Synthesize Polythiophene 9

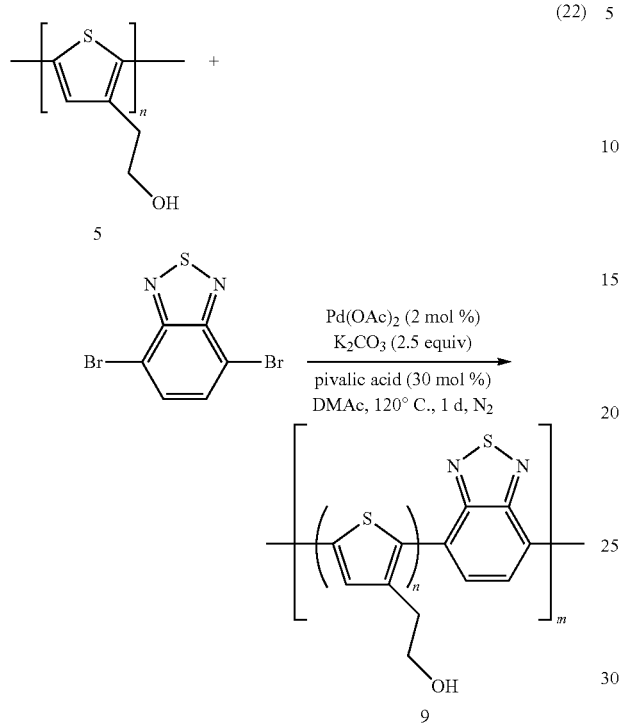

(22)

Procedures:
1. A mixture of Pd(OAc)$_2$ (2 mg), pivalic acid (10 uL), K$_2$CO$_3$ (87 mg), benzothiadiazole (137 mg), polythiophene 5 (124 mg) were stirred in dimethylacetamide for 1 d at 120° C. under N$_2$.
2. After cooling to room temperature, the mixture was poured into an aqueous solution of EDTA (pH=8).
3. The suspension was stirred overnight at room temperature.
4. The precipitate was filtrated and washed with 0.1 M HCl, DI water, MeOH and hexane.
5. The precipitate was dissolved in CHCl$_3$ and the solution was filtrated to remove the insoluble material.
6. Re-precipitation in a CHCl$_3$/MeOH solution to result in the product of polythiophene 9.

The process is summarized in Equation (22) above.

9.2 Coupling Reaction of New Polythiophene 7 (where R can be any Alkyl Chains Comprising Methyl, Ethyl, Propyl, i-Propyl, Butyl, Etc.) with Benzothiadiazole (BT) to Synthesize to Synthesize Polythiophene 10

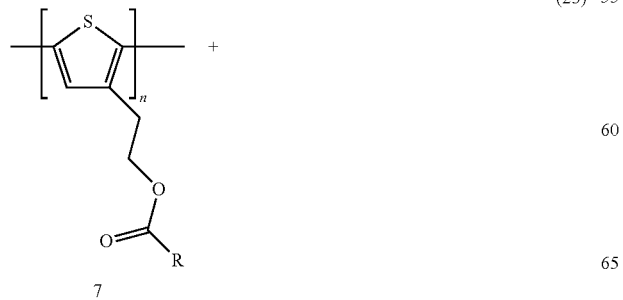

(23)

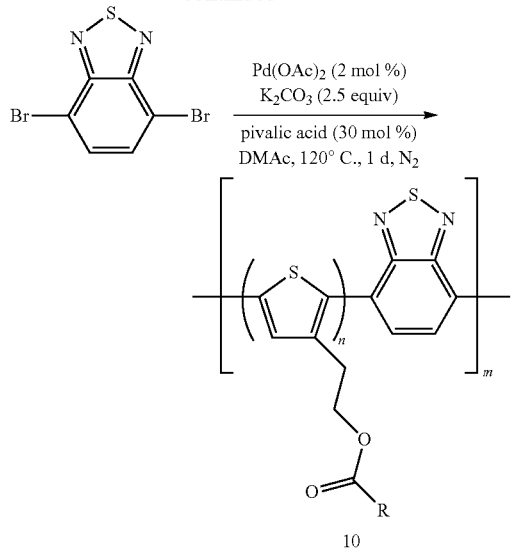

Procedures:
1. A mixture of Pd(OAc)$_2$ (2 mg), pivalic acid (10 uL), K$_2$CO$_3$ (87 mg), benzothiadiazole (137 mg), polythiophene 7 (124 mg) were stirred in dimethylacetamide for 1 d at 120° C. under N$_2$.
2. After cooling to room temperature, the mixture was poured into an aqueous solution of EDTA (pH=8).
3. The suspension was stirred overnight at room temperature.
4. The precipitate was filtrated and washed with 0.1 M HCl, DI water, MeOH and hexane.
5. The precipitate was dissolved in CHCl$_3$ and the solution was filtrated to remove the insoluble material.
6. Re-precipitation in a CHCl$_3$/MeOH solution to result in the product of polythiophene 10.

The process is summarized in Equation (23) above.

9.3 Coupling Reaction of New Polythiophene (where R$^1$, R$^2$, and R$^3$ can be any Alkyl Chains Comprising Methyl, Ethyl, Propyl, i-Propyl, Butyl, Etc.) with Benzothiadiazole (BT)

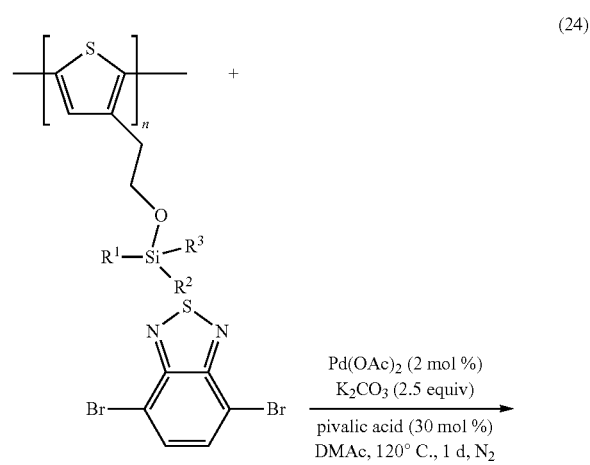

(24)

-continued

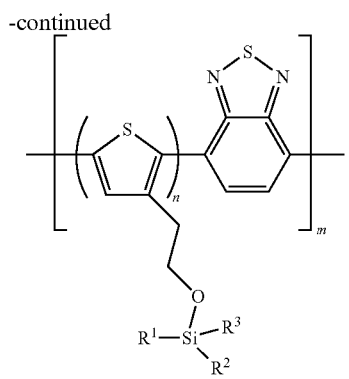

The process is summarized in Equation (24) above.

Referring now to FIGS. 7(A), 7(B), 7(C), and 7(D), the solubility tests of the polythiophene compounds of the present invention demonstrate that the new compounds are soluble in ethanol, acetone, ethyl acetate, and toluene.

Example 10

Study on the Solubility of $NH_2$-Functionalized Polythiophene in Ethanol

A reddish brown solid sample of $NH_2$-functionalized polythiophene (15 mg) was put into a glass bottle and 2 ml of ethanol was added to dissolve the compound at room temperature. A deep reddish-brown homogeneous solution was obtained as shown in FIG. 7 (A). The test demonstrated that $NH_2$-functionalized polythiophene is soluble in ethanol.

Example 11

Study on the Solubility of $NH_2$-Functionalized Polythiophene in Acetone

A reddish brown solid sample of $NH_2$-functionalized polythiophene (15 mg) was put into a glass bottle and 2 ml of acetone was added to dissolve the compound at room temperature. A deep reddish-brown homogeneous solution was obtained as shown in FIG. 7 (B). The test demonstrated that $NH_2$-functionalized polythiophene is soluble in acetone.

Example 12

Study on the Solubility of $NH_2$-Functionalized Polythiophene in Ethyl Acetate

A reddish brown solid sample of $NH_2$-functionalized polythiophene (10 mg) was put into a glass bottle and 2 ml of ethyl acetate was added to dissolve the compound at room temperature. A reddish-brown homogeneous solution was obtained as shown in FIG. 7 (C). The test demonstrated that $NH_2$-functionalized polythiophene is soluble in ethyl acetate.

Example 13

Study on the Solubility of $NH_2$-Functionalized Polythiophene in Toluene

A reddish brown solid sample of $NH_2$-functionalized polythiophene (5 mg) was put into a glass bottle and 2 ml of toluene was added to dissolve the compound at room temperature. A reddish-brown homogeneous solution was obtained as shown in FIG. 7 (D). The test demonstrated that $NH_2$-functionalized polythiophene is soluble in toluene.

Example 14

Study on the Potential Application of Polythiophenes for Electroluminescent Devices, Such as Organic Light Emitting Diode and Polymer Light-Emitting Diode All of the polythiophenes in Table 4 were readily dissolved in DMF, chloroform or dichlorobenzene, and were filtered by 0.45 μm PTFE filter. They display photoluminescence at room temperature under ambient condition when they are excited at their respective absorption bands and the maximum fluorescence peaks are found in the range of 505 to 630 nm.

TABLE 4

| Polythiophene | Chemical structure | Solvent | Excitation wavelength (nm), $\lambda_{ex}$ | Emission wavelength (nm), $\lambda_{em}$ |
|---|---|---|---|---|
| 12 | | DMF | 500 | 588 |

TABLE 4-continued
| Polythiophene | Chemical structure | Solvent | Excitation wavelength (nm), $\lambda_{ex}$ | Emission wavelength (nm), $\lambda_{em}$ |
|---|---|---|---|---|
| 13 | 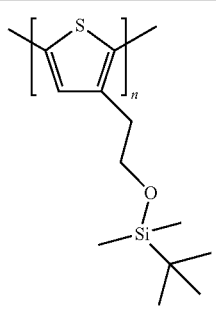 | DMF | 480 | 512, 630 |
| 14 | 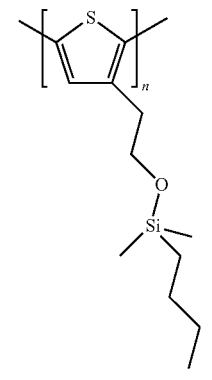 | DMF | 480 | 559 |
| 15 | 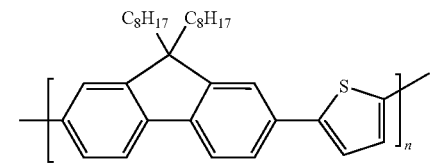 | CHCl$_3$ | 470 | 505 |
| 16 | 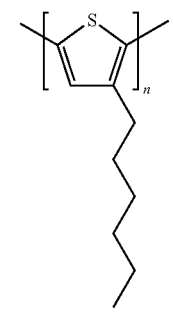 | CHCl$_3$ | 470 | 570 |
| 17 | 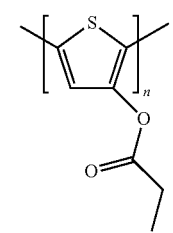 | DCB | 420 | 562 |

TABLE 4-continued

| Polythiophene | Chemical structure | Solvent | Excitation wavelength (nm), $\lambda_{ex}$ | Emission wavelength (nm), $\lambda_{em}$ |
|---|---|---|---|---|
| 18 | | $CHCl_3$ | 470 | 550 |
| 19 | | $CHCl_3$ | 470 | 580, 613 |

Polythiophene 14-19 emit green light in the range of 505 nm to 570 nm. Polythiophene 12 shows yellow emission color at 588 nm while polythiophene 13 exhibits green and red light emission with two peaks at 512 nm and 630 nm respectively. Polythiophene 19 shows emission color in the range from yellow to orange at 580 nm to 613 nm.

Similar polythiophene materials were previously shown to fabricate high efficient electroluminescent devices (I. F. Perepichka, et al., 2005; G. G. Malliaras, et al., 1993; J.-L. Bredas, et al., 1983; F. Chen, et al., 1996; M. Pomerantz, et al., 1999). Thus polythiophenes 12-19 as shown in Table 4, or other polythiophenes of the present invention, could be used in fabricating high efficient electroluminescent devices.

The photoluminescence spectra of polythiophenes 12-19 obtained are shown in FIGS. 11-18.

Example 15

Figure 19:
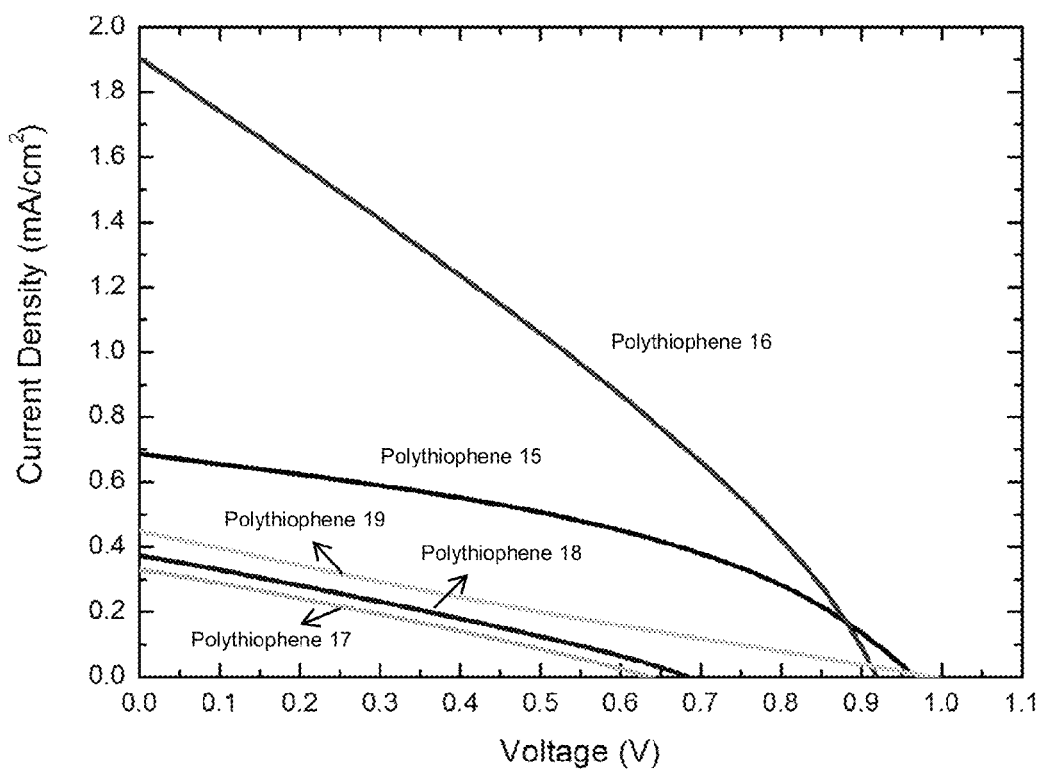
FIG. 19 shows the J-V characteristics of polythiophenes 15-19 doped with PCBM under illumination.
Figure 20:
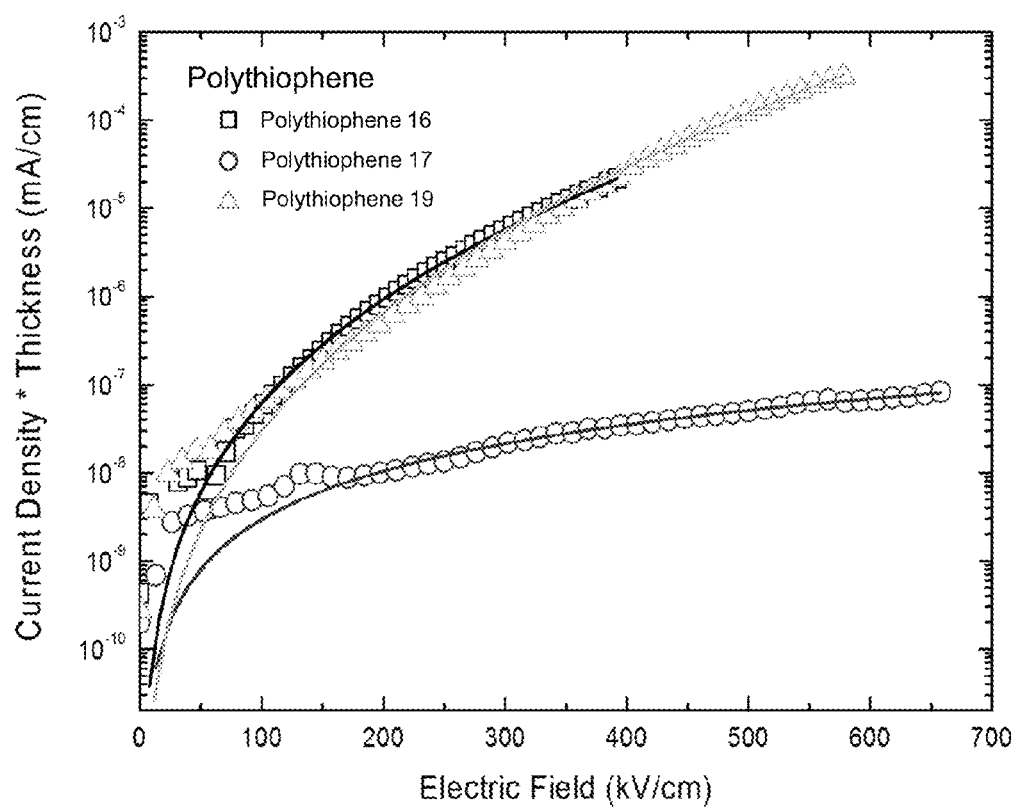
FIG. 20 shows the J-V characteristics of polythiophenes 16, 17, and 19 under dark condition. The hollowed symbols are the experimental data, while the solid is the fitted curve of $J_{SCL}$.

Study on the Potential Application of Polythiophenes 16, 17, and 19 for Fabricating Organic Photovoltaic Solar Cells, Transistor or Other Conducting Devices For photovoltaic (PV) measurements, the structure of fabricated device is ITO/PEDOT:PSS (30 nm)/Polymer: PCBM (1:1 wt %)/LiF (1 nm)/Al (120 nm) and the active area is 0.16 $cm^2$. The J-V characteristic under illumination is plotted in FIG. 19 and the PV parameters are summarized in Table 5. All of the polythiophenes have shown the PV characteristics, and so it is proven that the selected polythiophenes are the potential materials for PV cells fabrication.

TABLE 5

| Polythiophene | Thickness (nm) | Voc (V) | Jsc (mA/cm$^2$) | FF (%) | PCE (%) |
|---|---|---|---|---|---|
| 15 | 162 | 0.97 | 0.69 | 41.0 | 0.3 |
| 16 | 55 | 0.91 | 1.91 | 30.6 | 0.5 |
| 17 | 118 | 0.63 | 0.33 | 28.0 | 0.1 |
| 18 | 127 | 0.68 | 0.37 | 28.4 | 0.1 |
| 19 | 65 | 0.98 | 0.45 | 22.9 | 0.1 |

To investigate the conductivity (σ) of synthesized polythiophene, mobility (µ) determination should be the most directly method according to the following equation:

$$\sigma = nq\mu,$$

where n is the carrier concentration and q is the elementary charge.

In the study, J-V measurement in dark condition is employed for 16, 17 and 19 with the unipolar device structure, ITO/PEDOT:PSS (30 nm)/Polymer/Al (100 nm). The J-V characteristics are shown in FIG. 10. The hollowed symbols are the experimental data, while the solid lines are the fitted curve of space-charge-limited current ($J_{SCL}$). The mobility (µ) can then be obtained from the fitting parameters in the following equation:

$$J = \frac{9}{8}\mu\varepsilon\frac{E^2}{d},$$

where ε is permittivity, E is electric field and d is the device thickness.

The results are summarized in Table 6. It shows clearly that polythiophenes 16, 17 and 19 are conducting polythiophenes with the magnitude between $1\times10^{-7}$ to $1\times10^{-6}$ $cm^2/$ Vs. Therefore, all these investigated polythiophenes can be used for the fabrication of transistor or other conducting devices.

TABLE 6

| Polythiophene | Thickness (nm) | Mobility (cm$^2$/Vs) |
|---|---|---|
| 16 | 255 | $8.49 \times 10^{-7}$ |
| 17 | 152 | $1.34 \times 10^{-6}$ |
| 19 | 173 | $1.64 \times 10^{-7}$ |

What is claimed is:

1. A compound of formula Ic', comprising:

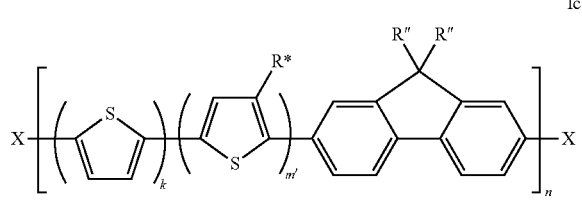

wherein
X is selected from the group consisting of hydrogen, bromine, chlorine, and methyl group;
m' is equal or greater than one;
k is equal to or greater than one;
n is equal to or greater than one;
R* is selected from the group consisting of ethanol, substituted ethanol, ethyl formate, substituted ethyl formate, ethoxy silane, and substituted ethoxy silane; and
R" is hydrogen or alkyl chain comprising $C_6H_{13}$, $C_8H_{17}$, and $C_{12}H_{25}$.

2. A compound of formula Id, comprising:

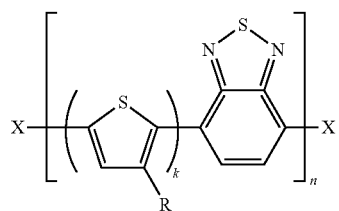

wherein
X is selected from the group consisting of hydrogen, bromine, chlorine, and methyl group;
k is equal to or greater than one;
n is equal to or greater than one;
R is NR$^1$R$^2$ or an alkoxy group, said alkoxy group is further selected from the group consisting of ethanol, substituted ethanol, ethyl formate, substituted ethyl formate, ethoxy silane, and substituted ethoxy silane,
and wherein R$^1$ and R$^2$ are independently selected from the group consisting of hydrogen, aldehyde, acid chloride, acid bromide, and isocyanate.

3. A composition comprising at least a compound according to claim 1 or 2 admixed with a solvent.

4. The composition according to claim 3, wherein said solvent comprises an organic solvent selected from the group consisting of acetone, acetonitrile, tetrahydrofuran, ethyl acetate, toluene, benzene, methanol, ethanol, 1-propanol, iso-propanol, DMSO, DMF, and halogenated hydrocarbon solvent.

5. The composition according to claim 4, wherein said solvent further comprises water.

6. A conductive polymer comprising at least a compound according to claim 1 or 2.

7. A solution comprising at least a compound according to claim 1 or 2, wherein said solution is adapted for using or making a thin film on a substrate.

8. The solution according to claim 7, wherein said solution is adapted for fabrication of a layer by using spin coating process or roll-to-roll process; wherein said layer is selected from the group consisting of a thin layer on a LED device as an active layer, a conductive layer for thermal management, and an active light absorption layer on an organic photovoltaic solar device.

9. An ink formulation comprising at least a compound according to claim 1 or 2, wherein said ink formulation is adapted for using or making a thin film on printed electronic devices.

10. The ink formulation according to claim 9, wherein said ink formulation is adapted for fabrication of a layer by using spin coating process or roll-to-roll process; wherein said layer is selected from the group consisting of a thin layer on a LED device as an active layer, a conductive layer for thermal management, and an active light absorption layer on an organic photovoltaic solar device.

* * * * *